(12) United States Patent
Tanaka

(10) Patent No.: US 6,392,810 B1
(45) Date of Patent: May 21, 2002

(54) LASER IRRADIATION APPARATUS, LASER IRRADIATION METHOD, BEAM HOMOGENIZER, SEMICONDUCTOR DEVICE, AND METHOD OF MANUFACTURING THE SEMICONDUCTOR DEVICE

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/409,908

(22) Filed: Oct. 1, 1999

(30) Foreign Application Priority Data

Oct. 5, 1998 (JP) .......................... 10-299141
Oct. 6, 1998 (JP) .......................... 10-283751

(51) Int. Cl.[7] .......................... G02B 27/10; H01S 3/10
(52) U.S. Cl. .......................... 359/622; 359/618; 359/626; 372/24; 372/25; 372/33; 219/121.8; 438/487; 438/166
(58) Field of Search .......................... 359/618, 619, 359/621, 622, 623, 626; 372/24, 25, 33, 28; 219/121.8, 121.68; 438/151, 166, 487

(56) References Cited

U.S. PATENT DOCUMENTS

| 4,409,724 A | 10/1983 | Tasch et al. |
| 4,599,133 A | 7/1986 | Miyao et al. |
| 5,145,808 A | 9/1992 | Sameshima et al. |
| 5,313,076 A | 5/1994 | Yamazaki et al. |
| 5,448,582 A | 9/1995 | Lawandy |
| 5,504,020 A | 4/1996 | Aomori et al. |
| 5,508,209 A | 4/1996 | Zhang et al. |
| 5,523,257 A | 6/1996 | Yamazaki et al. |
| 5,543,352 A | 8/1996 | Ohtani et al. |
| 5,561,081 A | 10/1996 | Takenouchi et al. |
| 5,576,556 A | 11/1996 | Takemura et al. |
| 5,580,801 A | 12/1996 | Maegawa et al. |
| 5,608,232 A | 3/1997 | Yamazaki et al. |
| 5,608,251 A | 3/1997 | Konuma et al. |
| 5,612,250 A | 3/1997 | Ohtani et al. |
| 5,623,157 A | 4/1997 | Miyazaki et al. |
| 5,648,277 A | 7/1997 | Zhang et al. |
| 5,719,065 A | 2/1998 | Takemura et al. |
| 5,804,878 A | 9/1998 | Miyazaki et al. |
| 5,815,494 A * | 9/1998 | Yamazaki et al. ............ 372/25 |
| 5,882,960 A | 3/1999 | Zhang et al. |
| 5,895,933 A | 4/1999 | Zhang et al. |
| 5,897,799 A | 4/1999 | Yamazaki et al. ..... 219/121.75 |
| 5,900,980 A | 5/1999 | Yamazaki et al. .......... 359/619 |
| 5,943,354 A | 8/1999 | Lawandy |
| 5,945,711 A | 8/1999 | Takemura et al. |
| 5,953,597 A | 9/1999 | Kusumoto et al. |
| 5,956,105 A | 9/1999 | Yamazaki et al. |
| 5,959,779 A | 9/1999 | Yamazaki et al. .......... 359/624 |

(List continued on next page.)

FOREIGN PATENT DOCUMENTS

| JP | 07-131034 | 5/1995 |
| JP | 07-161634 | 6/1995 |
| JP | 07-321339 | 12/1995 |

Primary Examiner—Loha Ben
(74) Attorney, Agent, or Firm—Eric J. Robinson; Nixon Peabody LLP

(57) ABSTRACT

One of objects of the present invention is to provide a method of carrying out a laser annealing with sufficient uniformity and high productivity in a wide thickness range of a non-single crystal semiconductor film. According to one aspect of the present invention, a laser irradiation apparatus for carrying out irradiation while scanning a linear laser beam in a beam width direction is characterized in that the laser beam on an irradiation surface has a first energy density in a first beam width and a second energy density in a second beam width, and the second energy density is higher than the first energy density.

66 Claims, 13 Drawing Sheets

U.S. PATENT DOCUMENTS

| | | |
|---|---|---|
| 5,962,872 A | 10/1999 | Zhang et al. |
| 5,968,383 A | 10/1999 | Yamazaki et al. ..... 219/121.75 |
| 6,002,101 A | 12/1999 | Yamazaki et al. ..... 219/121.75 |
| 6,002,523 A | 12/1999 | Tanaka ....................... 359/624 |
| 6,038,075 A | 3/2000 | Yamazaki et al. .......... 359/626 |
| 6,051,453 A | 4/2000 | Takemura |
| 6,104,535 A | 8/2000 | Tanaka ....................... 359/619 |
| 6,137,633 A | 10/2000 | Tanaka ....................... 359/619 |
| 6,157,492 A | 12/2000 | Yamazaki et al. .......... 359/623 |
| 6,212,012 B1 * | 4/2001 | Tanaka ....................... 359/624 |
| 6,215,595 B1 * | 4/2001 | Yamazaki et al. .......... 359/623 |
| 6,239,913 B1 * | 5/2001 | Tanaka ....................... 359/619 |
| 6,246,524 B1 * | 6/2001 | Tanaka ....................... 359/619 |
| 6,249,385 B1 * | 6/2001 | Yamazaki et al. .......... 359/626 |

* cited by examiner

Beam width

LASER IRRADIATION APPARATUS, LASER IRRADIATION METHOD, BEAM HOMOGENIZER, SEMICONDUCTOR DEVICE, AND METHOD OF MANUFACTURING THE SEMICONDUCTOR DEVICE

BACKGROUND OF THE INVENTION

1. Field of the Invention

The present invention relates to a structure for carrying out irradiation while scanning a linear laser beam, and to a structure for annealing a non-single crystal semiconductor film through irradiation of a linear laser beam while scanning the laser beam in a beam width direction. The present invention also relates to a semiconductor device, and to a method of manufacturing the semiconductor device.

2. Description of the Related Art

In recent years, extensive studies have been made on techniques for obtaining a crystalline semiconductor film (semiconductor film having crystallinity of single crystal, or polycrystal, microcrystal, etc.) by annealing a non-single crystal semiconductor film (not a single crystal semiconductor film such as an amorphous, polycrystalline, or microcrystalline semiconductor film) formed on an insulating substrate of glass etc. to crystalize the film or to improve its crystallinity. A silicon film is often used for the above semiconductor film.

As compared with a quartz substrate that has been conventionally frequently used, the glass substrate has such advantages that it is inexpensive, it is superior in workability, and a large substrate can be easily formed. This is the reason why the above-mentioned researches are carried out. Further, the reason why a laser is preferably used for crystallization is that the melting point of the glass substrate is low. The laser is capable of giving high energy to only the semiconductor film without varying the temperature of the substrate very much.

Since a crystalline silicon film formed by performing a laser annealing to a silicon film has high mobility, it is extensively used in such a manner that thin film transistors (TFTs) are formed with this crystalline silicon film, and are employed for, for example, a monolithic liquid crystal electrooptical device in which a TFT for driving pixels and a TFT for driver circuits are formed on one glass substrate. Since the crystalline silicon film is made of a large number of crystal grains, it is also called a polycrystalline silicon film or a polycrystalline semiconductor film.

A method in which a pulse laser beam of an excimer laser etc. with a high power output is optically converted into a square spot of several cm or a linear shape of several mm in width x several tens cm in length on a surface to be irradiated and the laser beam is scanned (irradiation position of the laser beam is moved relatively to the surface to be irradiated) to perform a laser annealing, is superior in mass production and is excellent in industry, so that the method is used by preference.

Particularly, if the linear laser beam is used, contrary to the case where a spot-like laser beam requiring to perform scanning in lengthwise and crosswise directions is used, laser irradiation to all the surface to be irradiated can be performed by scanning in only a direction normal to a line direction of the linear laser, so that a high mass production property can be obtained. The reason why scanning is performed in the direction normal to the line direction is that it is the scanning direction with the highest efficiency. Because of this high mass production property, usage of a linear laser beam obtained by converting an excimer laser beam through a suitable optical system has come to be the mainstream in the laser annealing nowadays.

Generally, in the case where the linear laser beam is formed, an originally rectangular beam is converted into a linear shape through a suitable lens group. The aspect ratio of the rectangular beam is about 2 to 5, and the rectangular beam is deformed into the linear beam with an aspect ratio of 100 or more through, for example, a lens group (this is referred to as a beam homogenizer) shown in FIGS. 2A and 2B. FIGS. 2A and 2B are an upper view and a sectional view, respectively, which show a conventional optical system for forming a linear laser beam. The foregoing lens group is designed such that the distribution of energy in the beam is also uniformed at the same time as the deformation. The method of uniforming the energy distribution is such that the original rectangular beam is divided into parts, and then, the divided parts are respectively enlarged and are overlapped to perform uniforming.

The apparatus shown in FIGS. 2A and 2B has a function of irradiating, as a linear beam, a laser light from an oscillator 201 (in this state, the light has a substantially rectangular shape) through an optical system designated by 202, 203, 204, 205, and 207. Reference numeral 206 designates a mirror.

The cylindrical lens array 202 has a function of dividing a beam into many parts. The divided many beams are synthesized by a cylindrical lens 205 into one.

This structure is needed to uniform the strength distribution in the beam. The combination of the cylindrical lens array 203 and the cylindrical lens 204 has a function similar to the combination of the cylindrical lens array 202 and the cylindrical lens 205.

That is, the combination of the cylindrical lens array 202 and the cylindrical lens 205 has a function of uniforming the energy (strength) distribution of the linear laser beam in the longitudinal direction, and the combination of the cylindrical lens array 203 and the cylindrical lens 204 has a function of uniforming the energy (strength) distribution of the linear laser beam in the width direction. When the cylindrical lens 207 is disposed through the mirror 206, a narrower linear laser beam can be obtained.

An optical system functioning to uniform an energy distribution in a beam is called a beam homogenizer. The optical system shown in FIGS. 2A and 2B is also one of beam homogenizers. A method of uniforming the energy distribution is such that an original rectangular beam is divided into parts, and then, the divided parts are respectively enlarged and are overlapped to perform uniforming.

Some problems have occurred when a laser annealing is applied to a non-single crystal semiconductor film by scanning a pulse laser beam converted into a linear shape. One of the problems is that the laser annealing can not be performed uniformly over the whole film surface according to conditions of the non-single crystal semiconductor film, for example, a film thickness.

In fabrication of a semiconductor device using a semiconductor film, there is a case where the thickness of the semiconductor film is made to be changed in accordance with the properties of a semiconductor component or device to be fabricated. For example, for obtaining high performance, a thin film with a thickness of, for example, about 25 to 55 nm is necessary. Alternatively, for obtaining high reliability, a thick film with a thickness of, for example, about 55 nm to 100 nm is required. Thus, according to the characteristics required for the semiconductor component to be formed, the film thickness of the semiconductor film is made to be changed.

For example, in the case where a non-single crystal semiconductor film with a thickness of 50 nm or less, rather than a non-single crystal semiconductor film with a thickness in the range of 50 nm to 60 nm, is irradiated with a laser beam, a phenomenon where stripes are formed at beam overlapping portions becomes conspicuous, and there is a case where semiconductor characteristics of the film become extremely different among the respective stripes (see FIG. 1).

Even in the case where a non-single crystal semiconductor film having a thickness of 60 nm or more is similarly subjected to a laser annealing, a phenomenon where stripes are formed at overlap portions between a beam and a beam can occur.

For example, in the case where a semiconductor device, for example, a thin film transistor is fabricated by using a crystalline semiconductor film in which the stripes are formed, and a liquid crystal display having such thin film transistors is fabricated, there occurs a disadvantage that the stripes directly appear on a screen display. Although this problem has been remedied by improving the film quality of a non-single crystal semiconductor film as an object to be irradiated by a laser or by fining a scanning pitch (interval between adjacent pulses) of the linear laser, it has not been satisfactory. According to experiments by the present applicant, it was most suitable that the scanning pitch was about one tenth of the beam width of the linear laser beam.

SUMMARY OF THE INVENTION

An object of the present invention is to provide a method of carrying out a laser annealing with sufficient uniformity and high productivity in a wide thickness range of a non-single crystal semiconductor film, and to provide a semiconductor device using a crystalline semiconductor film fabricated by such a method.

In order to solve the problems described above, according to one aspect of the present invention, there is provided a laser irradiation apparatus for carrying out irradiation while scanning a linear laser beam having a beam width comprising a first beam in a beam width direction, characterized in that the laser beam on an irradiation surface has a first energy density in a first beam width and a second energy density in a second beam width, and the second energy density is higher than the first energy density.

In the laser irradiation apparatus, the first beam width may be equal to the second beam width.

In the laser irradiation apparatus, scanning may be carried out from a side of the laser beam having the first energy density.

Alternatively, scanning may be carried out from a side of the laser beam having the second energy density.

Further, scanning is carried out from a side of the laser beam having the first energy density, and then, scanning is carried out from a side of the laser beam having the second energy density. Conversely, scanning may be performed from a side of the laser beam having the second energy density, and then, scanning may be performed from a side of the laser beam having the first energy density.

Further, more preferably, a difference between the first energy density and the second energy density is made to 4% to 30% of the first energy density.

Further, it is preferable that irradiation of the laser beam is carried out in an atmosphere of one selected from the group consisting of He, Ar, $N_2$ and a mixed gas of those.

According to another aspect of the present invention disclosed in the present application, there is provided a beam homogenizer comprising: an optical lens for functioning to divide a laser beam; and an optical system for synthesizing laser beams divided by the optical lens, characterized in that the optical lens includes a cylindrical lens and a semi-cylindrical lens (or it can be called half-cylindrical lens).

According to the homogenizer described above, a linear laser beam having the first energy density and the second energy density can be obtained.

The semi-cylindrical lens (or half-cylindrical lens) described above has a shape of one of two congruent solids obtained by dividing a cylindrical lens such that a sectional shape in a lengthwise direction becomes rectangular.

The optical lens may be constituted by a plurality of semi-cylindrical lens.

In the above-described laser irradiation apparatus, it is more preferable that the laser beam is a pulse laser having a frequency of 100 Hz or more.

Further, according to another structure of the present invention disclosed in the present specification, there is provided a laser irradiation method of carrying out irradiation while scanning a linear laser beam in a beam width direction, characterized in that the linear laser beam on an irradiation surface has a first energy density in a first beam width and a second energy density in a second beam width, and the second energy density is higher than the first energy density.

Further, according to another aspect of the present invention disclosed in the present application, there is provided a semiconductor device comprising a crystalline semiconductor film, characterized in that the crystalline semiconductor film has been irradiated with a linear laser beam having a first energy density in a first beam width and a second energy density higher than the first energy density in a second beam width on an irradiated surface, while having been scanned in a beam width direction.

Preferably, the semiconductor device is a thin film transistor including an active layer of the crystalline semiconductor film.

It is preferable that the thickness of the crystalline semiconductor film is 25 nm to 75 nm. If the film thickness is in this range, when the film is irradiated with the linear laser beam having the first energy density in the first beam width and the second energy density higher than the first energy density in the second beam width on the irradiation surface while being scanned in the beam width direction, in-plane uniformity of film quality is improved.

According to another aspect of the present invention disclosed in the present application, there is provided a method of manufacturing the semiconductor device, comprising the steps of: obtaining a crystalline semiconductor film by irradiating a non-single crystal semiconductor film on a substrate with a linear laser beam while the beam is scanned in a beam width direction, and manufacturing the semiconductor device by using the crystalline semiconductor film, characterized in that the linear laser beam on an irradiation surface has a first energy density in a first beam width and a second energy density in a second beam width, and the second energy density is higher than the first energy density.

In the above-described manufacturing method, it is preferable that the first beam width is equal to the second beam width.

In the above-described manufacturing method, scanning may be carried out from a side of the laser beam having the first energy density.

In the above-described manufacturing method, scanning may be carried out from a side of the laser beam having the second energy density.

In the above-described manufacturing method, a first scanning is carried out in a direction of the first energy density side of the beam width to said non-single crystal semiconductor film to anneal the film into a crystalline semiconductor film, and then, a second scanning is carried out in a direction of the second energy density side of the beam width after the first scanning.

In the above-described manufacturing method, scanning may be carried out from a side of the laser beam having the second energy density relative to the non-single crystal semiconductor film to anneal the film into a crystalline semiconductor film, and then, scanning is carried out from a side of the laser beam having the first energy density relative to the crystalline semiconductor film to carry out an annealing.

In the above-described manufacturing method, it is preferable that a difference between the first energy density and the second energy density is 4% to 30% of the first energy density.

In the above-described manufacturing method, it is preferable that irradiation is carried out in an atmosphere of one selected from the group consisting of He, Ar, $N_2$ and a mixed gas of those.

In the above manufacturing method, it is preferable that the irradiation is carried out in the He atmosphere. By this, in the case where a cap layer etc. of a silicon oxide film etc. is not provided on the non-single crystal semiconductor film but the film is directly subjected to the laser irradiation, the in-plane uniformity of the film quality of the crystalline silicon film after the annealing is raised, and the phenomenon where the vicinity of a grain boundary of a crystal rises after the laser irradiation, called a ridge, is extremely lessened.

In the above manufacturing method, it is more preferable that the laser beam is a pulse laser with a frequency of 100 Hz or more. When the laser beam is made to have such a frequency, the scanning speed can be increased, so that the processing speed can be raised and the productivity of the semiconductor device is improved.

DETAILED DESCRIPTION OF THE PREFERRED EMBODIMENTS

Figure 1:
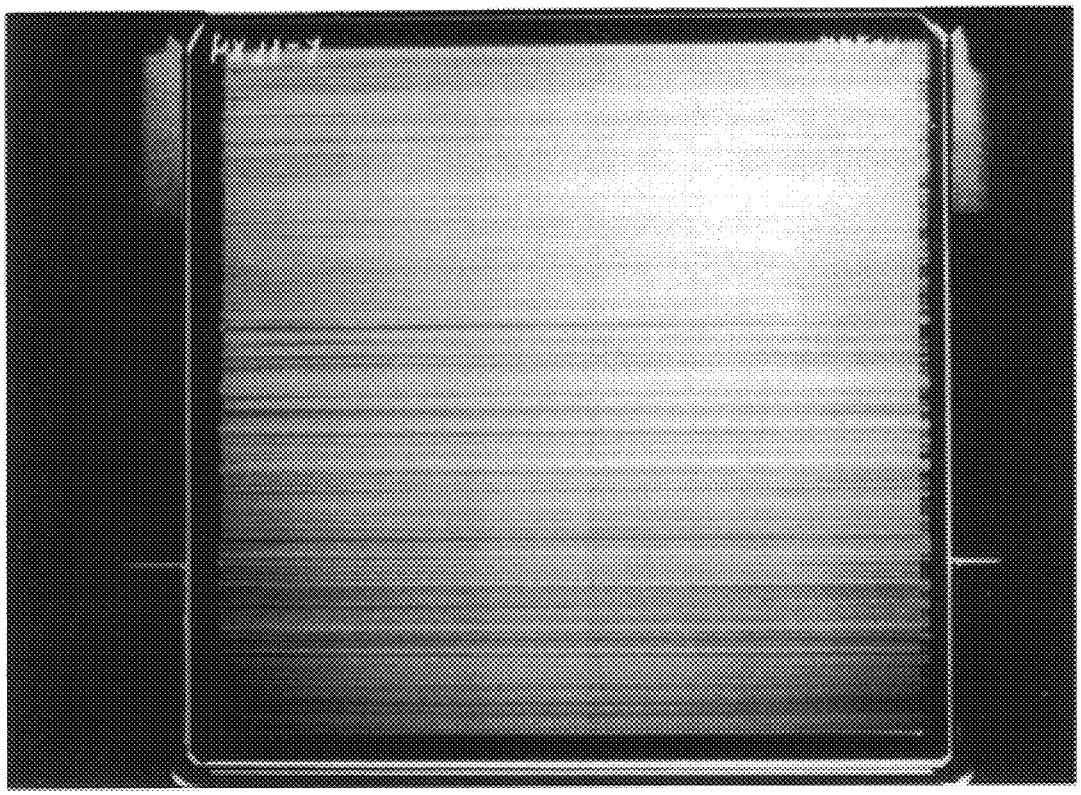
FIG. 1 is a photograph of a silicon film crystallized by a linear laser.
Figures 2A, 2B:
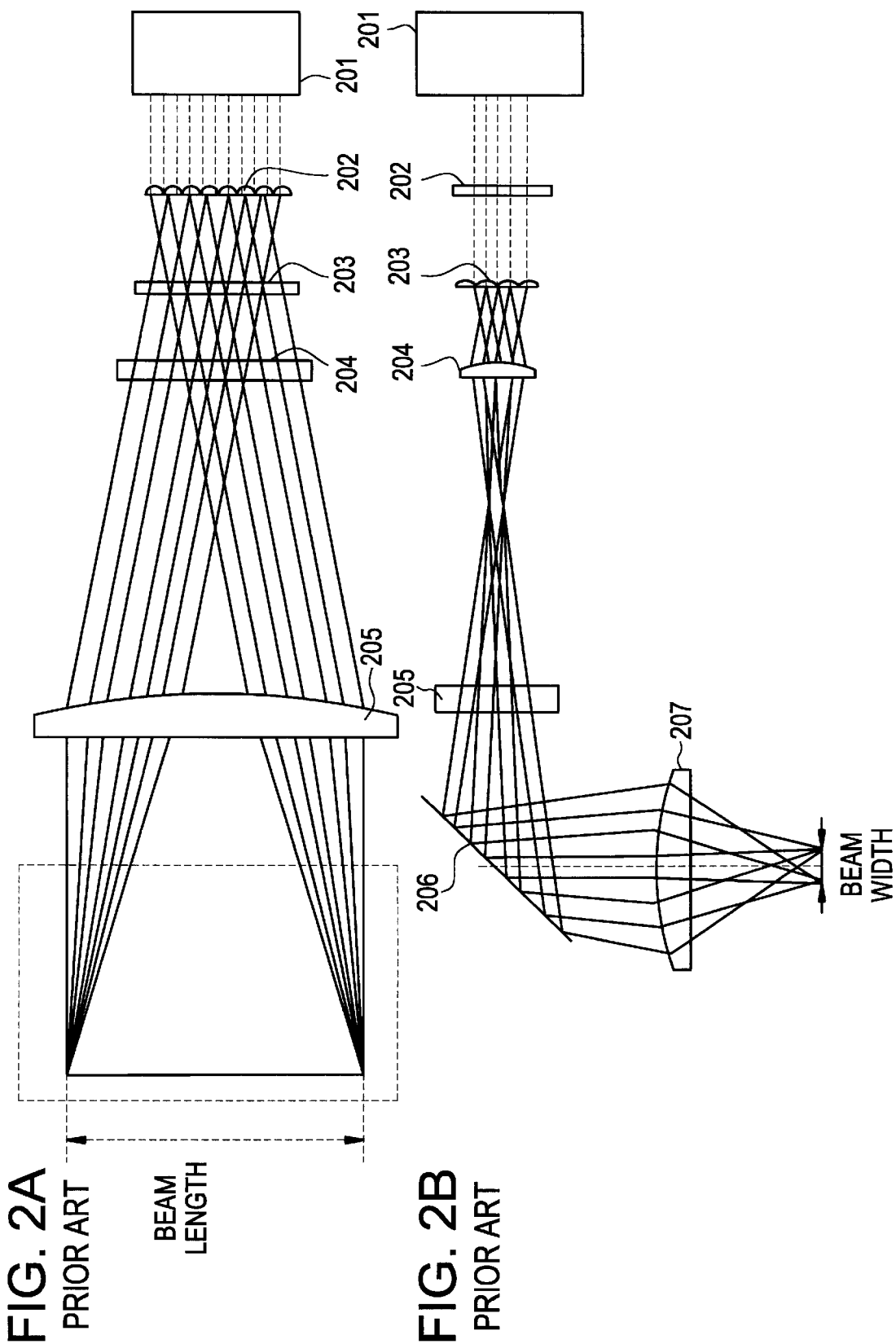
FIGS. 2A and 2B are an upper view and a sectional view, respectively, which show a conventional optical system for forming a linear laser beam.
Figure 3:
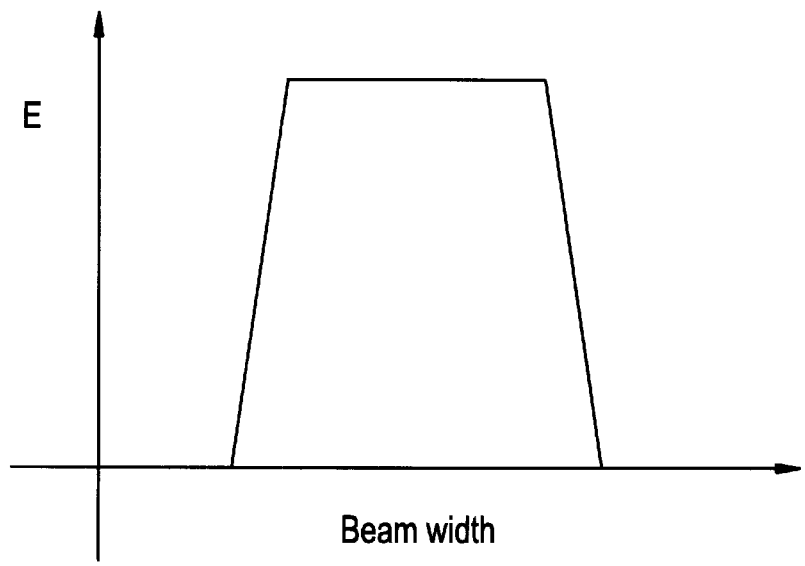
FIG. 3 is a view showing an energy distribution of a linear laser beam in a width direction.

An optical system (beam homogenizer) for forming a linear laser beam shown in FIGS. 2A and 2B forms a linear laser beam with very high uniformity. When the energy distribution of the linear laser beam is seen in the section of the beam width direction of the linear laser beam, the section has a rectangular distribution as shown in FIG. 3.

By changing this energy distribution, the present applicant searched conditions under which a more uniform laser annealing was able to be carried out. As the method of the search, a beam attenuating filter for a laser was disposed immediately in front of a non-single crystal semiconductor film, so that an energy distribution was changed. In view of the property of the optical system shown in FIGS. 2A and 2B, the filter was disposed immediately in front of (within 1 mm) the non-single crystal semiconductor film.

As a result, as compared with the conventional method using the optical system shown in FIGS. 2A and 2B, even if the thickness of a silicon film was 40 nm, the laser annealing was able to be uniformly carried out.

At this time, as the beam attenuating filter, one having a transmissivity of 90% was used. Besides, at this time, the filter was disposed to cover substantially the half of the linear laser beam in the width direction thereof.

Figure 4:
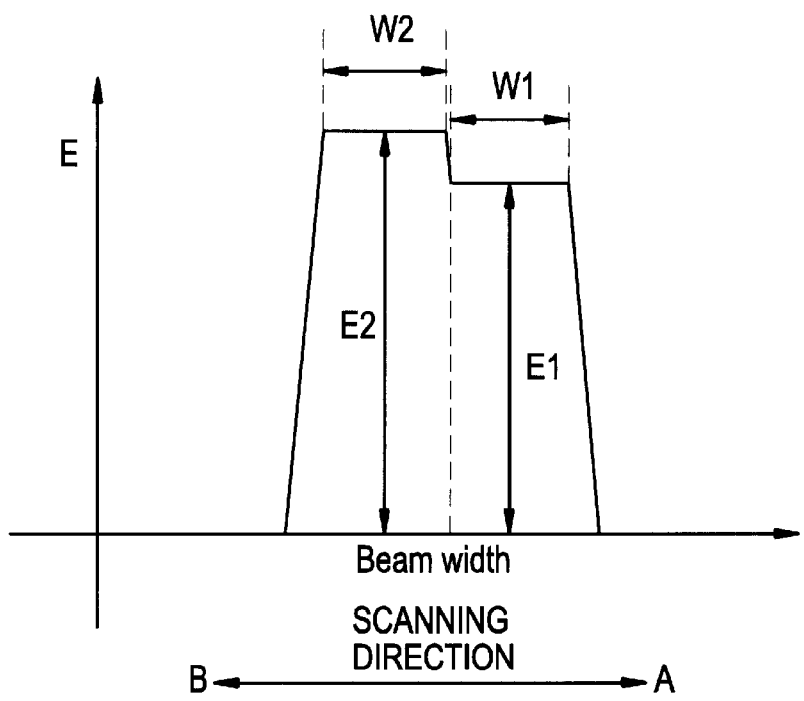
FIG. 4 is a view showing an energy distribution of a linear laser beam in a width direction.

FIG. 4 shows the energy distribution. FIG. 4 shows the energy distribution of the section of the linear laser beam in the width direction similarly to FIG. 3. When laser irradiation with this energy distribution was carried out under the same condition as the conventional laser irradiation method, traces of the laser irradiation became inconspicuous as compared with the conventional case. At this time, scanning of the linear laser beam was carried out while a side of the laser beam having a lower energy was made the front. That is, the silicon film was subjected to the laser annealing by scanning the linear laser beam in a direction A of FIG. 4.

In FIG. 4, two kinds of energies (E1, E2) and their widths (W1, W2) characterizing the shape of the linear laser beam are defined. Here, providing that E1<E2, an effect was able to be obtained within the range of $1.04 \leq E2/E1 \leq 1.3$. With respect to the relation of W1 and W2, W1≈W2 was suitable.

Further, the present applicant searched what effect was obtained by the foregoing laser beam for a thick silicon film (55 nm or more). As a result, with respect to a silicon film with a thickness of 65 nm, when the laser annealing was carried out while the film was scanned in the direction (direction B shown in FIG. 4) reverse to the case where the thin silicon film was treated, traces of the laser irradiation became inconspicuous as compared with the conventional case.

The linear laser beam shown in FIG. 4 was able to carry out a uniform laser annealing even to a silicon film with a thickness of 50 to 60 nm. With respect to the direction of scanning at the time of irradiation, the uniform annealing was able to be carried out in any of the directions A and B shown in FIG. 4.

By such structure, the thickness range of the non-single crystal semiconductor film in which the annealing was able to be uniformly carried out by the linear laser beam was remarkably widened. However, although disposing a filter for a laser immediately in front of (within 1 mm) a non-single crystal semiconductor film can realize the energy distribution of FIG. 4 through a simple structure, it has a problem in durability, and a fine adjustment of an apparatus is required.

Figure 5:
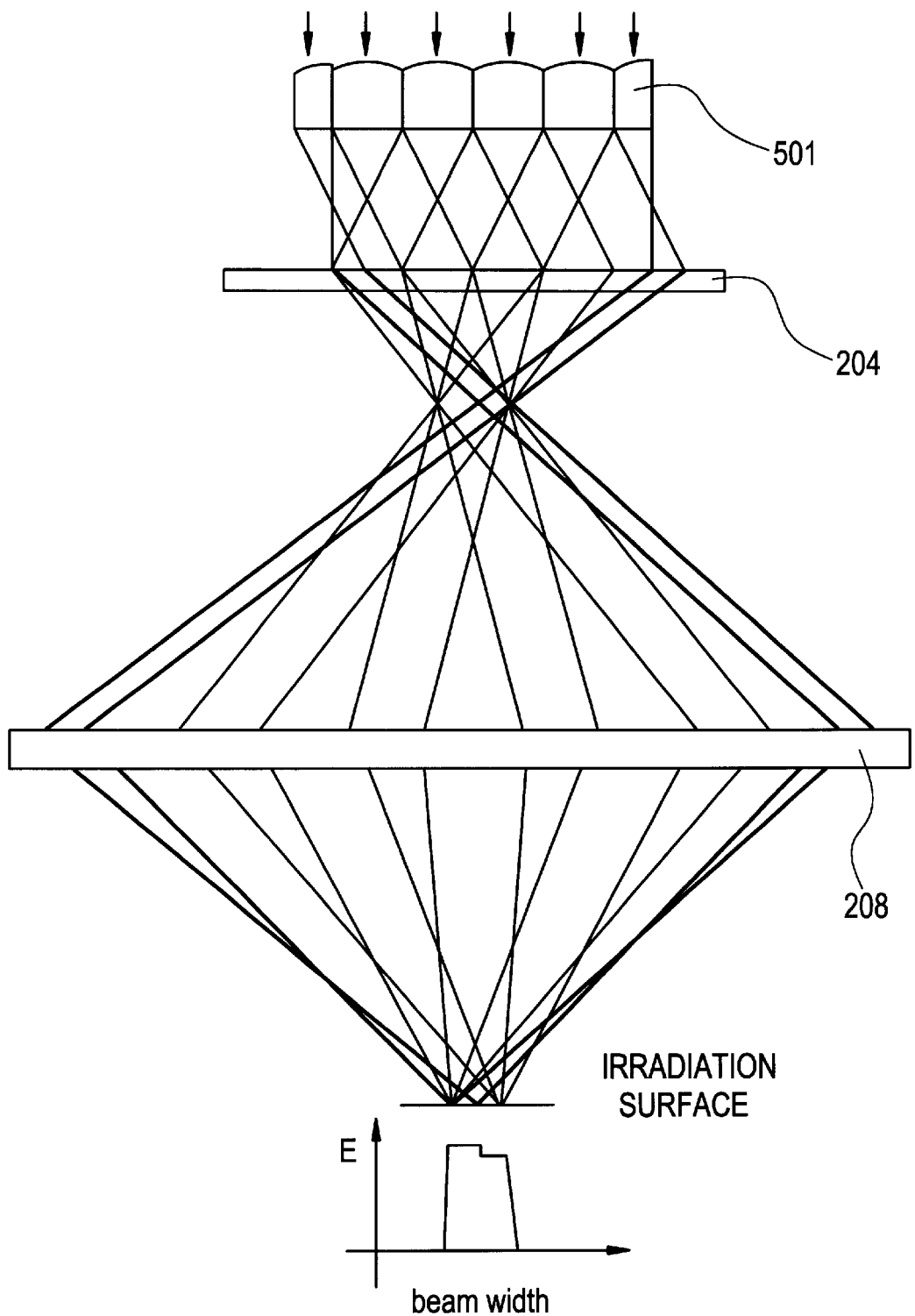
FIG. 5 is a view showing a part of an optical system for forming a linear laser beam.

Then the present applicant invented an optical system capable of obtaining the energy distribution shown in FIG. 4 by changing, in the optical system shown in FIGS. 2A and 2B, the structure of a portion having a function of uniforming the energy distribution of the linear laser beam in the beam width. A part of the optical system is shown in FIG. 5. The optical system of FIG. 5 is such that the cylindrical lens array 203 shown in FIGS. 2A and 2B is replaced by a cylindrical lens array 501.

In FIG. 5, a portion etc. having a function of uniforming the energy distribution in the beam length are omitted for simplicity.

The feature of the optical system of FIG. 5 is in a structure of the cylindrical lens array 501. By this cylindrical lens array, a linear laser beam with a two stage energy distribution is formed on an irradiation surface. The feature of the cylindrical lens array 501 is that a cylindrical lens having a normal shape is combined, in an array state, with a lens in which its section in a width direction (direction parallel to a main surface of a cylindrical lens and vertical to an edge line) has a shape of one of cut lenses obtained by cutting a cylindrical lens having a normal shape at an optical axis in half (in this specification, this lens is referred to as a semi-cylindrical lens).

Figure 6:
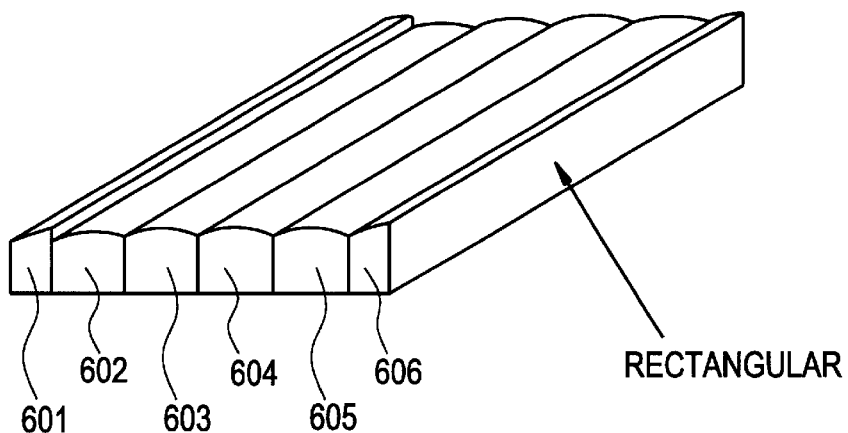
FIG. 6 is a solid view showing an example of a cylindrical lens array.
Figure 7A:
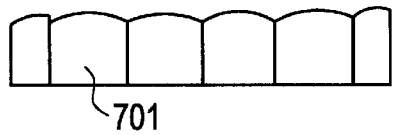
FIGS. 7A to 7E are views showing an example of a cylindrical lens array.
Figure 7D:
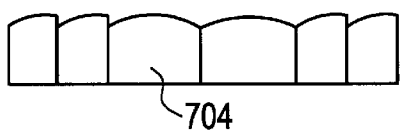
Figure 7B:
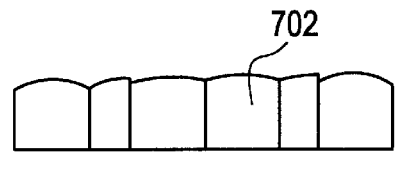
Figure 7E:
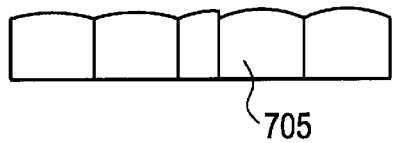
Figure 7C:
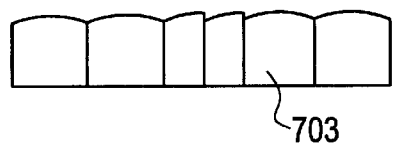

FIG. 6 three-dimensionally shows the cylindrical lens array 501. Cylindrical lenses 602, 603, 604 and 605 of FIG. 6 have a normal shape, respectively. The shape of each of semi-cylindrical lenses 601 and 606 is made such that its section in a width direction (direction parallel to a main surface of a cylindrical lens and vertical to an edge line) has a shape of one of cut lenses obtained by cutting a cylindrical lens having a normal shape at an optical axis in half. The cut surface in the longitudinal direction is rectangular, and the lenses which have been divided into two have such shapes that they are congruent or substantially congruent.

As a result, although a light passing through one normal cylindrical lens expands to the full width of the linear laser beam, a light passing through the semi-cylindrical lens expands only to the one side half of the width of the linear laser beam. Thus, the optical system shown in FIG. 5 can form the linear laser beam having the energy distribution shown in FIG. 4.

Although the shape of the cylindrical lens array 501 can have various shapes as shown in FIGS. 7A to 7E, the shapes are made optimum according to the energy distribution of an incident laser beam. Normally, it was suitable that the difference between the energy densities E1 and E2 of the linear laser beam shown in FIG. 4 was about 4 to 30% of the density E1. For the purpose of forming such a beam, the energy of a laser beam passing through the semi-cylindrical lens had only to be made about 2 to 15% of the total energy of the laser beam.

Examples of the cylindrical lens array 501 having such shape are shown by 701, 702, 703 and 704 in FIGS. 7A to 7D, respectively. Even a simple structure like a cylindrical lens array 705 in FIG. 7E has the effect of the present invention. Reference numeral 701 (FIG. 7A) shows an example in which a semi-cylindrical lens is arranged to each of both ends of a plurality of cylindrical lenses. Reference numeral 702 (FIG. 7B) shows an example in which one semi-cylindrical lens is disposed between a plurality of cylindrical lenses and a plurality of such combinations are arranged. Reference numeral 703 (FIG. 7C) shows an example in which a plurality of semi-cylindrical lenses are arranged at the center of a plurality of cylindrical lenses. Reference numeral 704 (FIG. 7D) shows an example in which a plurality of semi-cylindrical lenses are arranged at both ends of a plurality of cylindrical lenses. Reference numeral 705 (FIG. 7E) shows an example in which one semi-cylindrical lens is arranged at the center of a plurality of cylindrical lenses.

In the cylindrical lens array, although the number of semi-cylindrical lenses may be one, a plurality of semi-cylindrical lenses have a better effect in improvement of such uniformity, and it is more preferable that the number is even. However, the directions of all the semi-cylindrical lenses are the same. That is, in the width direction of the cylindrical lens array (direction parallel to a main plane of a cylindrical lens and vertical to an edge line), the shapes of the plurality of semi-cylindrical lenses are the same.

With respect to the structure of the cylindrical lens array 501, in the case where the energy distribution of the laser beam incident on the cylindrical lens array 501 is axisymmetric (for example, Gaussian distribution) or nearly axisymmetric, if the semi-cylindrical lenses in the cylindrical lens array are arranged at symmetric positions with respect to the symmetry axis of the axisymmetric energy distribution, the uniformity of energy density in the beam width direction in each beam width having the energy density is improved and a more uniform annealing can be carried out.

The present invention will be described in more detail with reference to embodiments described below.

[Embodiment 1]

Here, a method of annealing a non-single crystal silicon film having a thickness of 35 nm by a linear laser beam will be described. As described above, the film thickness of 35 nm is thin for a semiconductor film and is suitable for fabrication of a semiconductor component with high characteristics.

First, a glass substrate (Corning 1737) of 127 mm square was prepared. This substrate had sufficient durability against temperature of up to 600° C. A silicon oxide film with a thickness of 200 nm was formed as an under film on the glass substrate. Further, an amorphous silicon film with a thickness of 35 nm was formed thereon. Both the films were formed by a plasma CVD method.

The substrate on which the films had been formed was subjected to a heat treatment at 450° C. for 1 hour. This step is a step of decreasing a hydrogen density in the amorphous silicon film. If the hydrogen density in the film is too high, the film can not withstand laser energy. Thus, this step was introduced. It was suitable that the hydrogen density in the film was of the order of $10^{20}$ atoms/cm$^3$.

Figure 8:
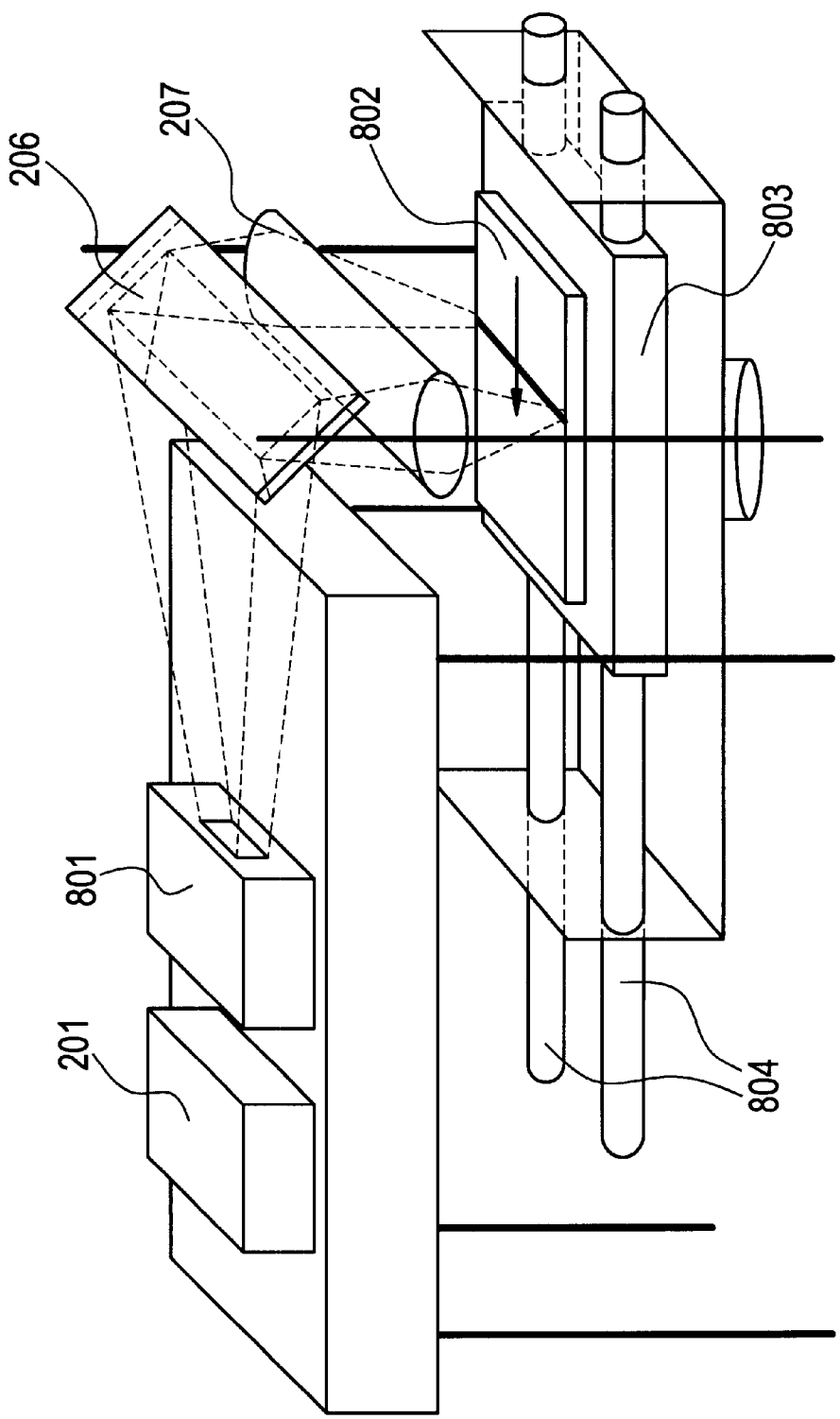
FIG. 8 is a view showing a laser irradiation apparatus according to embodiments 1 and 2.

FIG. 8 shows an example of a laser irradiation apparatus.

FIG. 8 schematically shows the laser irradiation apparatus.

In FIG. 8, the laser irradiation apparatus has such a function that a pulse laser beam which is radiated from a laser oscillator 201 and a light path of which is changed by an optical system 801 is reflected by a mirror 206, and is irradiated to a substrate 802 to be treated while being condensed by a cylindrical lens 207.

As the laser oscillator 201, one oscillating a XeCl excimer laser beam (wavelength of 308 nm) was used here. Other than that, a KrF excimer laser (wavelength of 248 nm) or the like may be used. Further, a continuous-wave excimer laser may be used.

As the optical system 801, one obtained by replacing the cylindrical lens array 203 in the optical system shown in FIGS. 2A and 2B by the cylindrical lens array 701 of the invention was used. Although the cylindrical lens array 202 is constituted by convex lenses, even if it is constituted by concave lenses or a combination of concave and convex lenses, the essence of the present invention is not influenced at all.

The reason why the cylindrical lens array 701 was used was that an excimer laser beam incident on the cylindrical lens array 701 had an energy distribution approximated by a Gaussian distribution. The reason why the cylindrical lens array 701 having the semi-cylindrical lenses at both ends was selected was that the difference between the energy densities E1 and E2 shown in FIG. 4 became an optimum value for uniformly carrying out laser irradiation to the silicon film having a thickness of 35 nm.

With respect to the beam, like a beam (Gaussian beam) having an energy distribution approximated by the Gaussian distribution, in which the center of the energy distribution had the most intense energy and the energy was decreased toward ends, when the semi-cylindrical lens was arranged at the center of the cylindrical lens array 501, the difference between the energy densities E1 and E2 became largest, and when it was arranged at both ends thereof, the energy difference became smallest.

The energy of the laser beam necessary for performing a uniform laser annealing of the amorphous silicon film having a thickness of 35 nm fabricated in the above steps was E2=300 mJ/cm$^2$ and E1=280 mJ/cm$^2$.

These conditions depend on characteristics of the semiconductor film to be irradiated.

The substrate 802 to be treated was disposed on a stand 803. The stand 803 is straightly moved in the normal direction (containing a plane including the linear laser beam) with respect to the line direction of the linear laser beam by a moving mechanism 804, so that it becomes possible to irradiate the upper surface of the treated substrate 802 while the laser beam is scanned.

Figure 9:
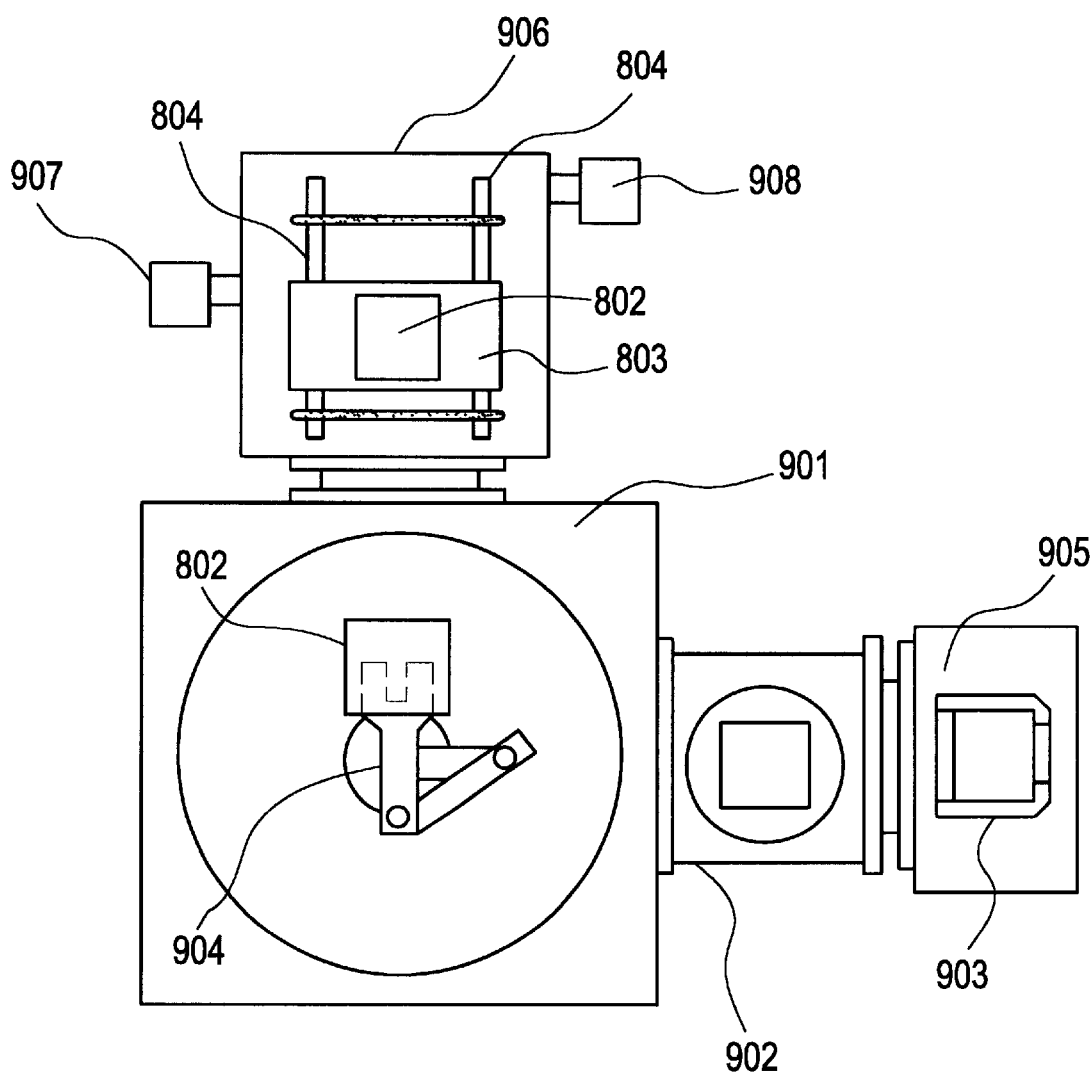
FIG. 9 is a top view showing a laser irradiation apparatus according to embodiments 1 and 2.

An apparatus shown in FIG. 9 will be described. A cassette 903 housing a number of treated substrates 802, for example, 20 substrates is disposed in a load/unload chamber 905. One substrate is moved from the cassette 903 to an alignment chamber by a robot arm 904.

In the alignment chamber 902, an alignment mechanism for correcting positional relation between the substrates 802 to be treated and the robot arm 904 is disposed. The alignment chamber 902 is connected to the load/unload chamber 905.

The substrate is transferred to a substrate transfer chamber 901 by the robot arm 904, and is further transferred to a laser irradiation chamber 906 by the robot arm 904. In FIG. 8, the linear laser beam irradiated on the treated substrate is made 0.4 mm in width×135 mm in length. Besides, the widths are made w1=w2=0.2 mm.

An atmosphere is replaced with He prior to laser irradiation. At this time, after the substrate atmosphere was diluted by a vacuum pump 907, He was introduced from a gas bomb 908 into the laser irradiation chamber 906. The atmosphere was made 1 atm. This was carried out to prevent pollution of the film from the air. The atmosphere may be N$_2$ or Ar. Besides, the atmosphere may be a mixture gas of those. If the laser irradiation apparatus is placed in a clean room, the irradiation may be carried out in the air. If the He atmosphere is adopted, in the case where a cap layer such as a silicon oxide film is not provided on the non-single crystal semiconductor film but the film is crystallized by direct laser irradiation as in this embodiment, the film quality of a crystalline silicon film after the annealing becomes more uniform, and a phenomenon where the vicinity of a grain boundary of a crystal rises after the laser irradiation, called a ridge, is extremely lessened.

The stand 803 was moved in one direction along the moving mechanism 804 at 1.2 mm/s so that scanning started from the energy density E1 (that is, when attention was paid to one point of the amorphous silicon film, the energy of first impingement became E1), whereby the linear laser beam was scanned. The oscillation frequency of the laser was made 30 Hz, and when attention was paid to one point of the silicon film, the laser beams of 10 shots in total were irradiated. The number of the shots is suitably selected within the range of 5 to 50 shots/one point.

For the purpose of increasing the productivity, the oscillation frequency of the excimer laser might be made 100 Hz or more. At this time, in order to keep the number of the shots, it was necessary to make the moving mechanism 804 scan at a speed of 4 mm/s or more.

At the time of the laser irradiation, even if the scanning direction of the linear laser beam was any of the directions A and B shown in FIG. 4, it was possible to obtain an effect. However, according to the difference in the state (hydrogen content, thickness, etc.) of the non-single crystal semiconductor film, the optimum direction was changed. For example, with respect to a silicon film having a thickness of 45 nm, when scanning in the direction B was carried out once again after scanning in the direction A was first carried out one time, more uniform laser irradiation was able to be carried out.

By such steps, it was possible to obtain a crystalline silicon film with superior in-plane uniformity of film quality.

After the laser irradiation is completed, the treated substrate 802 is returned to the substrate transfer chamber 902 by the robot arm 904. The treated substrate 802 is transferred to the load/unload chamber 905 by the robot arm 904 and is housed in the cassette 903.

In this way, the laser annealing step is completed. By repeating the foregoing step in this way, many substrates can be continuously treated one by one.

Incidentally, in this embodiment, only scanning of the linear laser beam from the side of the energy density E1 was carried out. However, there is a case where uniformity is further improved by carrying out scanning from the side-of the energy density E2 after such scanning.

[Embodiment 2]

Here, a method of annealing a non-single crystal silicon film having a thickness of 65 nm by a linear laser beam will be described. As described above, the film thickness of 65 nm is thick for a semiconductor film, and is suitable for fabrication of a semiconductor component with high reliability.

First, a glass substrate (Corning 1737) of 127 mm square was prepared. This substrate had sufficient durability against temperature of up to 600° C. A silicon oxide film with a thickness of 200 nm was formed as an under film on the glass substrate. Further, an amorphous silicon film with a thickness of 65 nm was formed thereon. Both the films were formed by a plasma CVD method.

The substrate on which the films had been formed was subjected to a heat treatment at 500° C. for 1 hour. This step is a step of decreasing a hydrogen density in the amorphous silicon film. If the hydrogen density in the film is too high, the film can not withstand laser energy. Thus, this step was introduced. It was suitable that the hydrogen density in the film was of the order of $10^{20}$ atoms/cm$^3$.

FIG. 8 shows the laser irradiation apparatus of the present invention. FIG. 8 schematically shows the laser irradiation apparatus.

In FIG. 8, the laser irradiation apparatus has such a function that a pulse laser beam which is radiated from the laser oscillator 201 and a light path of which is changed by the optical system 801 is reflected by the mirror 206, and is irradiated to the substrates 802 to be treated while being condensed by the cylindrical lens 207.

As the laser oscillator 201, one oscillating a XeCl excimer laser beam (wavelength of 308 nm) was used here. Other than that, a KrF excimer laser (wavelength of 248 nm) or the like might be used.

As the optical system 801, one obtained by replacing the cylindrical lens array 203 in the optical system shown in FIGS. 2A and 2B by the cylindrical lens array 702 of the present invention was used. Although the cylindrical lens array 202 is constituted by convex lenses, even if it is constituted by concave lenses or a combination of concave and convex lenses, the essence of the present invention is not influenced at all.

The reason why the cylindrical lens array 702 was used was that an excimer laser beam incident on the cylindrical lens array 702 had an energy distribution approximated by a Gaussian distribution. The reason why the cylindrical lens array 702 having the semi-cylindrical lenses, each semi-cylindrical lens positioned between an end cylindrical lens and the center cylindrical lens, was selected was that the difference between the energy densities E1 and E2 shown in FIG. 4 became an optimum value for uniformly carrying out laser irradiation to the silicon film having a thickness of 65 nm.

With respect to the beam, like a beam (Gaussian beam) having an energy distribution approximated by the Gaussian distribution, in which the center of the energy distribution had the most intense energy and the energy was decreased toward ends, when the semi-cylindrical lens was arranged at the center of the cylindrical lens array 501, the difference between the energy densities E1 and E2 became the largest, and when it was arranged at both ends thereof, the energy difference became the smallest.

The energy of the laser beam necessary for carrying out a uniform laser annealing of the amorphous silicon film having a thickness of 65 nm fabricated in the above steps was E2=450 mJ/cm$^2$ and E1=380 mJ/cm$^2$.

These conditions depend on characteristics of the semiconductor film to be irradiated.

The substrates 802 to be treated was disposed on the stand 803. The stand 803 is straightly moved in the normal direction (containing the plane including the linear laser beam) with respect to the line direction of the linear laser beam by the moving mechanism 804, so that it becomes possible to irradiate the upper surface of the substrates 802 to be treated while the laser beam is scanned.

The apparatus shown in FIG. 9 will be described. The cassette 903 housing a number of treated substrates 802, for example, 20 substrates is disposed in the load/unload chamber 905. One substrate is moved from the cassette 903 to the alignment chamber by the robot arm 904.

In the alignment chamber 902, the alignment mechanism for correcting positional relation between the substrates 802 to be treated and the robot arm 904 is disposed. The alignment chamber 902 is connected to the load/unload chamber 905.

The substrate is transferred to the substrate transfer chamber 901 by the robot arm 904, and is further transferred to the laser irradiation chamber 906 by the robot arm 904. In FIG. 8, the linear laser beam irradiated on the substrates 802 to be treated is made 0.4 mm in width×135 mm in length. Besides, the widths are made w1=w2=0.2 mm.

An atmosphere was replaced with He prior to the laser irradiation. This was carried out to prevent pollution of the film from the air. The atmosphere might be N$_2$ or Ar. Alternatively, the atmosphere might be a mixture gas of those. If the laser irradiation apparatus was placed in a clean room, irradiation might be performed in the air. If the He atmosphere is adopted, in the case where a cap layer such as a silicon oxide film is not provided on the non-single crystal semiconductor film but the film is crystallized by direct laser irradiation as in this embodiment, the film quality of a crystalline silicon film after annealing becomes more uniform, and a phenomenon where the vicinity of a grain boundary of a crystal rises after the laser irradiation, called a ridge, is extremely lessened.

The stand 803 was moved in one direction at 1.2 mm/s so that scanning started from the energy density E2 (that is, when attention was paid to one point of the amorphous silicon film, the energy of first impingement became E2), whereby the linear laser beam was scanned. The oscillation frequency of the laser was made 30 Hz, and when attention was paid to one point of the silicon film, the laser beams of 10 shots in total were irradiated. The number of the shots is suitably selected within the range of 5 to 50 shots/one point.

After the laser irradiation is completed, the treated substrate 802 is returned to the substrate transfer chamber 902 by the robot arm 904. The treated substrate 802 is transferred to the load/unload chamber 905 by the robot arm 904 and is housed in the cassette 903.

By such steps, it was possible to obtain the crystalline silicon film with superior in-plane uniformity of film quality.

In this way, the laser annealing step is completed. By repeating the foregoing step in this way, many substrates can be continuously treated one by one.

Incidentally, in this embodiment, only scanning of the linear laser beam from the side of the energy density E2 (in the direction B of FIG. 4) was carried out. However, there is a case where uniformity is further improved by carrying out scanning from the side of the energy density E1 (in the direction A of FIG. 4) after such scanning.

[Embodiment 3]

Although Embodiments 1 and 2 show examples of the amorphous silicon films as the non-single crystal semiconductor films to be subjected to laser annealing, a crystalline silicon film obtained by thermally crystallizing an amorphous silicon film may be used as a non-single crystal semiconductor film.

Further, when the amorphous silicon film is thermally crystallized, the crystallinity may be improved by adding an element for promoting crystallinity into the amorphous silicon film. In this case, sufficient crystallization can be made by a heat treatment at about 550° C. for 4 hours. As an element for promoting the crystallinity, nickel, germanium, iron, palladium, tin, lead, cobalt, platinum, copper, gold, etc. can be enumerated.

In order to add the element for promoting crystallinity into the amorphous silicon film, a layer containing the element for promoting crystallinity is formed on an upper surface or lower surface (upper surface of an under film of the amorphous silicon film) of the amorphous silicon film. The layer may be formed on the whole surface of the upper surface or lower surface of the amorphous silicon film or may be formed on a part thereof. In the case where the layer is formed on a part of the upper surface or lower surface of the amorphous silicon film, in a region of the amorphous silicon film which does not overlap with the layer, crystals grow in the lateral direction in the amorphous silicon film.

As a method of forming the layer, a solution containing the element for promoting crystallization (for example, 10 ppm) is applied by a spin coating method or the like. In addition to the method, a layer having a thickness of, for example, 1 to 5 mm and containing the element for promoting crystallinity may be formed by a sputtering method or a vacuum evaporation method. Alternatively, a layer of the element for promoting crystallinity may be formed by a treatment of subjecting the upper surface or lower surface of the amorphous silicon film to plasma generated by using an electrode containing the element for promoting crystallinity.

There is a case where a crystalline silicon film fabricated by such a method includes many defects since crystallizing temperature is low. So, a laser irradiation is carried out to raise characteristics as a semiconductor component through further improvement of crystallinity.

[Embodiment 4]

In this embodiment, a description will be made on an example in which a TFT (thin film transistor) is fabricated by using a crystalline silicon film obtained in Embodiment 1, 2 or 3. Steps of this embodiment are shown in FIGS. 10A to 10D.

Figure 10A:
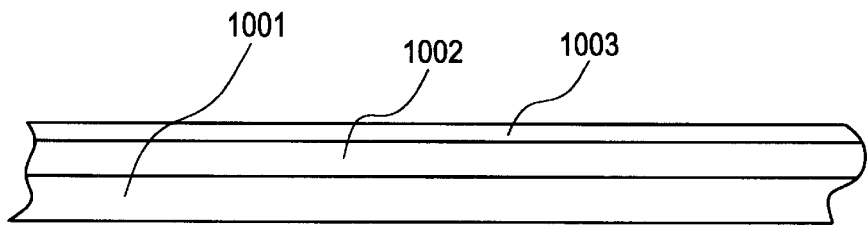
FIGS. 10A to 10D are views showing steps of embodiment 4.

In FIGS. 10A to 10D, a silicon oxide film 1002 with a thickness of 200 nm is provided as an under film on a substrate 1001 of glass etc., and a crystalline silicon film 1003 with a thickness of 50 nm is formed on such a substrate. As the crystalline silicon film 1003, one fabricated by a laser annealing method disclosed in the present specification is used. For example, one obtained in Embodiment 1 or Embodiment 2 is used (FIG. 10A).

Figure 10B:
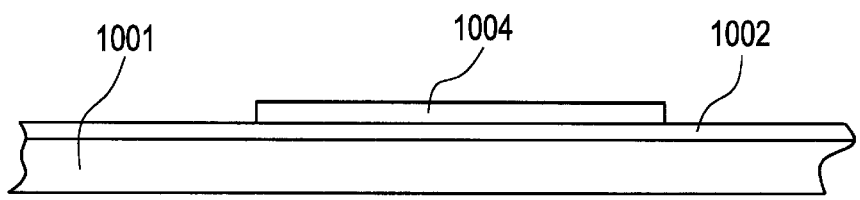

The crystalline silicon film 1003 is patterned so that an island-like active layer pattern 1004 of a TFT is formed. A channel formation region and a high resistance region are formed in this active layer pattern (FIG. 10B).

After the active layer is formed, a silicon oxide film is formed to a thickness of 150 nm as a gate insulating film 1005 by a plasma CVD method. A temperature in steps subsequent to the formation of the gate insulating film 1005 is made not to exceed that of the film formation of the gate insulating film 1005. By doing so, a TFT especially superior in S-value characteristics can be fabricated.

Next, an Al film containing Sc is formed to a thickness of 400 nm by a sputtering method. Then this film is patterned to obtain a gate electrode 1006. Further, the gate electrode 1006 may be obtained through an anodic oxidation method by forming an anodic oxidation film 1007 with a thickness of 200 nm on the Al film surface where the pattern is exposed.

This anodic oxidation film has a function of electrically and physically protecting the surface of the gate electrode. Besides, in a subsequent step, it functions to form a high resistance region, called an offset region, adjacent to the channel region.

Next, in the case where the gate electrode 1006 and the anodic oxidation film 1007 are formed, doping of phosphorus is carried out using the anodic oxidation film as a mask.

A source region 1008, a channel formation region 1009, a drain region 1010, and offset regions 1011 and 1012 are formed in a self-aligning manner by carrying out the doping of phosphorus. In this embodiment, phosphorus with a dosage of $5 \times 10^{14}$ ions/cm$^2$ was introduced by using an ion doping apparatus.

Next, phosphorus is activated by a laser. Laser irradiation was carried out by a method shown in Embodiment 1. By this, uniform activation was able to be carried out in the inside of the substrate surface.

An atmosphere was replaced by He prior to the laser irradiation. This was carried out to prevent pollution of the film from the air. The atmosphere might be $N_2$ or Ar. Alternatively, the atmosphere might be a mixture gas of those. If the laser irradiation apparatus was placed in a clean room, the irradiation might be carried out in the air.

Figure 10C:
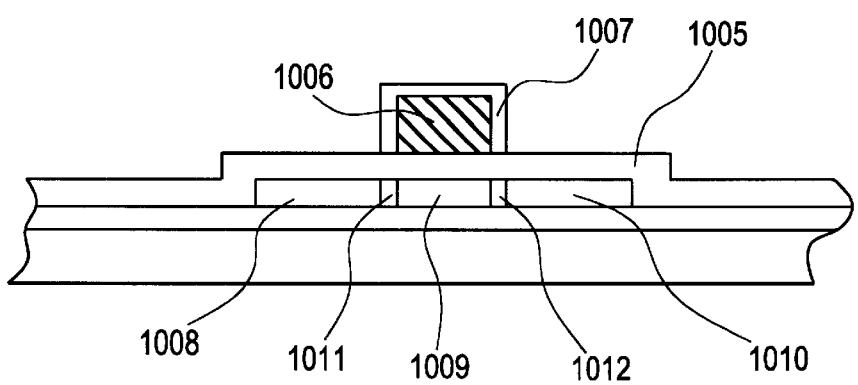

The energy density of the laser beam was made about E1=170 mJ/cm$^2$ and E2=200 mJ/cm$^2$. Since a suitable energy density in this step is varied according to the kind of the laser, the method of irradiation, and the state of the semiconductor film, adjustment is made according to those. The sheet resistance of the source/drain region was lowered down to 1 KΩ/□ by the laser irradiation (FIG. 10C).

When the semiconductor film was activated by the laser, an effect was obtained in any of the directions A and B shown in FIG. 4 as the scanning direction of the linear laser beam.

Next, as an interlayer insulating film, a silicon nitride film 1013 with a thickness of 25 nm is formed by a plasma CVD method, and further, a silicon oxide film 1014 with a thickness of 900 nm is formed.

Figure 10D:
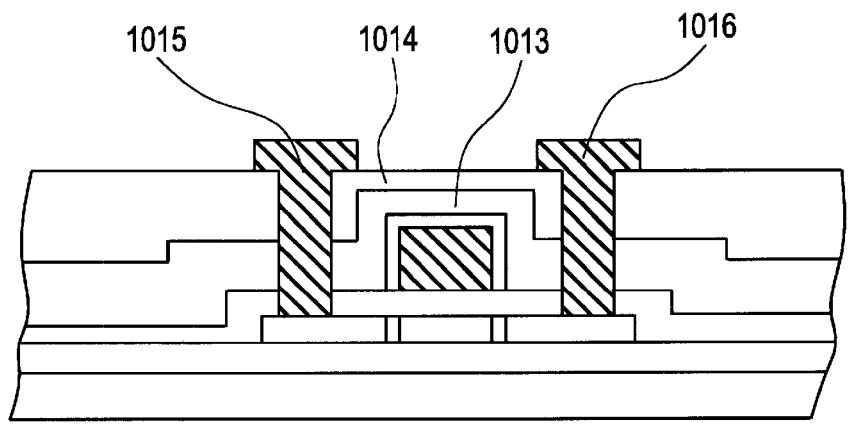

Next, contact holes are formed, and a source electrode 1015 and a drain electrode 1016 are formed (FIG. 10D).

In this way, an N-channel TFT is completed. In this embodiment, since phosphorus was introduced in the source region and the drain region, the N-channel TFT was fabricated. However, when a p-channel type is to be fabricated, doping of boron, instead of phosphorus, has only to be carried out.

In the case where, for example, an active matrix type liquid crystal display was manufactured by the use of a TFT fabricated with the crystalline semiconductor film formed by the above-mentioned method, as compared with a conventional case, stripes as traces of laser treatment was able to be made inconspicuous or to be removed. This was because fluctuation in characteristics of the individual TFTs owing to the present invention, especially fluctuation in mobility was suppressed.

Incidentally, although an example of a top gate type (coplanar type) has been shown as a TFT in Embodiment 4, the present invention can be also applied to a TFT of a stagger type, reverse stagger type of bottom gate type, or reverse coplanar type.

[Embodiment 5]

Figure 11:
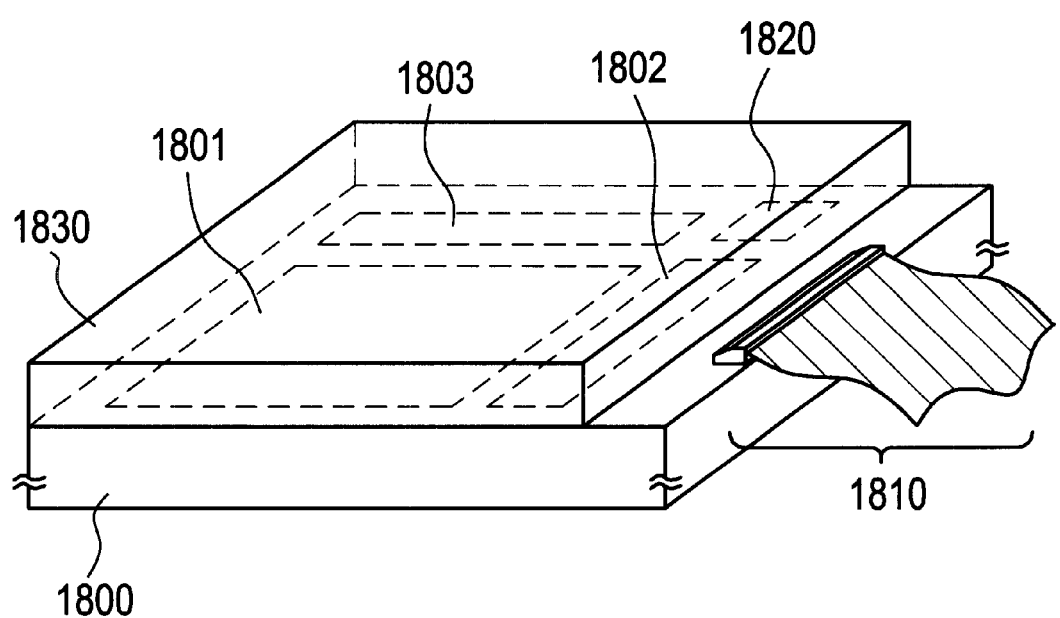
FIG. 11 is a view showing a structure of a semiconductor device (liquid crystal display device) according to embodiment 5.

In this embodiment, an example of a liquid crystal display device using a semiconductor device and its manufacturing method disclosed in the present application is shown in FIG. 11. Since well-known means may be used for a manufacturing method of a pixel TFT (pixel switching element) and a cell assembling step, their detailed description is omitted.

In FIG. 11, reference numeral 1800 designates a substrate having an insulating surface (a glass substrate or a plastic substrate provided with a silicon oxide film); 1801, a pixel matrix circuit; 1802, a scanning line driving circuit; 1803, a signal line driving circuit; 1830, an opposite substrate; 1810, an FPC (Flexible Printed Circuit); and 1820, a logic circuit. As the logic circuit 1820, a circuit for performing such a processing that an IC is conventionally substituted, such as a D/A converter, a γ-correction circuit, or a signal dividing circuit, can be formed. Of course, it is also possible to provide an IC chip on the substrate and to perform a signal processing thereon.

Although the description has been made on the liquid crystal display device as an example, it is needless to say that the present invention can be applied to an EL (electroluminescence) display device or an EC(electrochromic) display device as long as the display device is of an active matrix type.

Moreover, it does not matter if the fabricated liquid crystal display device is of a transmission type or a reflection type. Like this, the present invention can be applied to any active matrix type electrooptical device (semiconductor device).

When the semiconductor device shown in this embodiment is fabricated, any structure of Embodiments 1–4 may be adopted, and the respective embodiments can be freely combined and used.

[Embodiment 6]

This example demonstrates a process for producing an EL (electroluminescence) display device using a semiconductor device manufactured by a method disclosed in the present application.

Figure 14A:
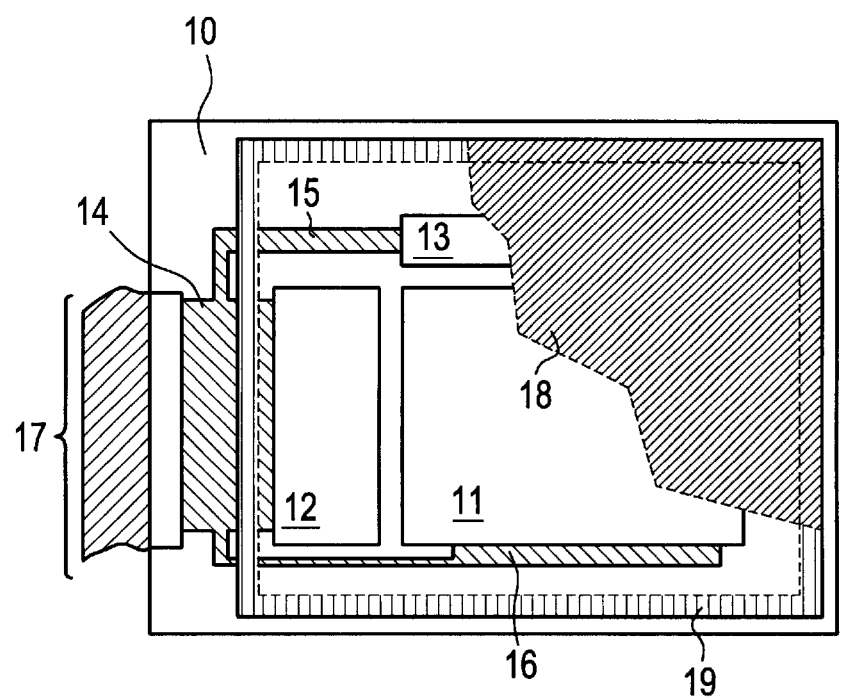
FIGS. 14A to 14B are views showing examples of EL display device according to embodiment 6.

FIG. 14A is a top view showing an EL display device which was produced using the invention of the present application. In FIG. 14A, there are shown a substrate 10, a pixel part 11, a driving circuit from the source 12, and a driving circuit from the gate 13, each driving circuit connecting to wirings 14–16 which reach FPC 17 leading to external equipment.

At least the pixel part, preferably together with the driving circuit, is enclosed by a sealing material (or housing material) 18. The sealing material 18 may be a concave metal plate or glass plate which encloses the element; alternatively, it may be an ultraviolet curable resin. A concave metal plate should be fixed to the substrate 10 with an adhesive 19 so that an airtight space is formed between the metal plate and the substrate 10. Thus, the EL element is completely sealed in the airtight space and completely isolated from the outside air.

It is desirable that the cavity 20 between the sealing material 18 and the substrate 10 be filled with an inert gas (such as argon, helium, and nitrogen) or a desiccant (such as barium oxide), so as to protect the EL element from degradation by moisture.

Figure 14B:
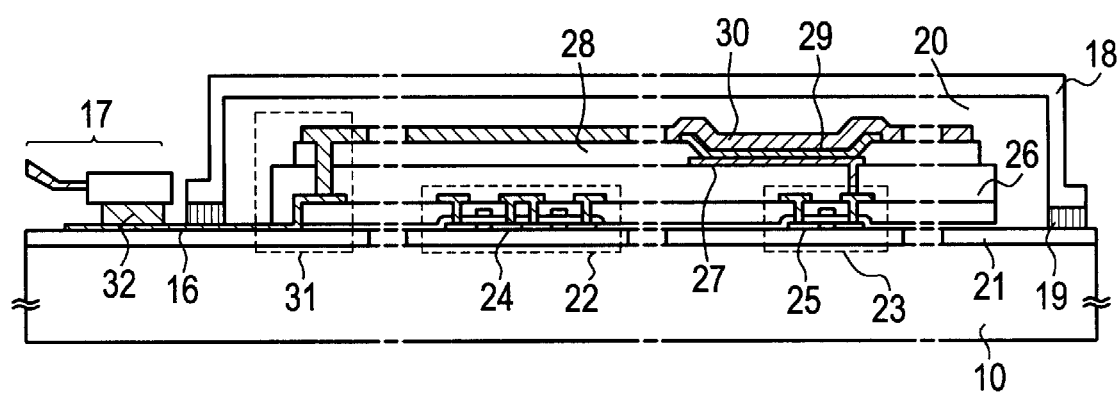

FIG. 14B is a sectional view showing the structure of the EL display device in this Example. There is shown a substrate 10, an underlying coating 21, a TFT 22 for the driving circuit, and a TFT 23 for the pixel unit. (The TFT 22 shown is a CMOS circuit consisting of an n-channel type TFT and a p-channel type TFT. The TFT 23 shown is the one which controls current to the EL element.) These TFTs may be of any known structure (top gate structure or bottom gate structure).

The invention of the present application may be employed to form the semiconductor layer which becomes the active layer 24 of TFT 22 for the driving circuit and the active layer 25 of TFT 23 for the pixel unit. Further, any known technology may be employed in the processes other than the semiconductor layer forming process.

Upon completion of TFT 22 (for the driving circuit) and TFT 23 (for the pixel unit), with their active layer being the semiconductor layer formed according to the invention of the present application, a pixel electrode 27 is formed on the interlayer insulating film (planarizing film) 26 made of a resin. This pixel electrode is a transparent conductive film which is electrically connected to the drain of TFT 23 for the pixel unit. The transparent conductive film may be formed from a compound (called ITO) of indium oxide and tin oxide or a compound of indium oxide and zinc oxide. On the pixel electrode 27 is formed an insulating film 28, in which is formed an opening above the pixel electrode 27.

Subsequently, the EL layer 29 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 30. Prior to this step, it is desirable to clear moisture and oxygen as much as possible from the interface between the EL layer 29 and the cathode 30. This object may be achieved by forming the EL layer 29 and the cathode 30 consecutively in a vacuum, or by forming the EL layer 29 in an inert atmosphere and then forming the cathode 30 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 30. To be concrete, the EL layer 29 is coated by vapor deposition with a lithium fluoride film (1 nm thick) and an aluminum film (300 nm thick) sequentially. Needless to say, the cathode 30 may be formed from MgAg electrode which is a known cathode material. Subsequently, the cathode 30 is connected to a wiring 16 in the region indicated by 31. The wiring 16 to supply a prescribed voltage to the cathode 30 is connected to the FPC 17 through an electrically conductive paste material 32.

The electrical connection between the cathode 30 and the wiring 16 in the region 31 needs contact holes in the interlayer insulating film 26 and the insulating film 28. These contact holes may be formed when the interlayer insulating film 26 undergoes etching to form the contact hole for the pixel electrode or when the insulating film 28 undergoes etching to form the opening before the EL layer is formed. When the insulating film 28 undergoes etching, the interlayer insulating film 26 may be etched simultaneously. Contact holes of good shape may be formed if the interlayer insulating film 26 and the insulating film 28 are made of the same material.

The wiring 16 is electrically connected to FPC 17 through the gap (filled with an adhesive 19) between the sealing material 18 and the substrate 10. As in the wiring 16 explained above, other wirings 14 and 15 are also electrically connected to FPC 17 under the sealing material 18.

The above-mentioned EL display device constructed according to the invention of the present application is advantageous in that the electrical characteristics of TFTs vary less owing to the uniform crystallinity in the semiconductor layer as the active layer of TFT. Therefore, it produces display images of good quality.

[Embodiment 7]

A semiconductor device and a method of manufacturing the same disclosed in the present application can be applied to the whole of conventional IC techniques. That is, the present invention can be applied to all semiconductor circuits presently put on the market. For example, the present invention may be applied to a microprocessor such as a RISC processor integrated on one chip or an ASIC processor, and may be applied to a signal processing circuit typified by a driver circuit for a liquid crystal (D/A converter, γ-correction circuit, signal dividing circuit, etc.) or to a high frequency circuit for a portable equipment (portable telephone, PHS, mobile computer).

A semiconductor circuit such as a microprocessor is mounted on various electronic equipments, and functions as a central circuit. As typical electronic equipments, a personal computer, a portable information terminal equipment, and other all household electric appliances can be enumerated. Besides, a computer for controlling a vehicle (automobile, electric train, etc.) can also be enumerated. The present invention can also be applied to such a semiconductor device.

Incidentally, when the semiconductor device shown in this embodiment is fabricated, any structure of Embodiments 1–4 may be adopted, and the respective embodiments can be freely combined and used.

[Embodiment 8]

A CMOS circuit and a pixel matrix circuit formed through carrying out the present invention may be applied to various electro-optical devices (active matrix type liquid crystal display devices, active matrix type EL display devices, active matrix type EC display devices). Namely, the present invention may be embodied in all the electronic equipments that incorporate those electro-optical devices as display media.

As such an electronic equipment, a video camera, a digital camera, a projector (rear-type projector or front-type projector), a head mount display (goggle-type display), a navigation system for vehicles, a personal computer, and a portable information terminal (a mobile computer, a cellular phone, or an electronic book) may be enumerated. Examples of those are shown in FIGS. 12A to 12H and 13A to 13D.

Figure 12A:
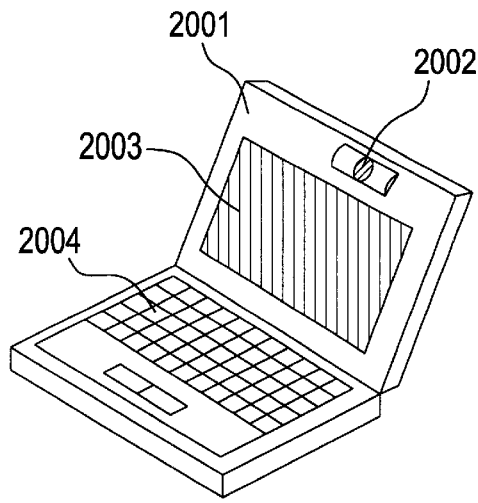
FIGS. 12A to 12H are views showing examples of semiconductor devices (electronic equipments) according to embodiment 8.

FIG. 12A shows a personal computer comprising a main body 2001, an image inputting unit 2002, a display device 2003, and a key board 2004. The present invention is applicable to the image inputting unit 2002, the display device 2003, and other signal control circuits.

Figure 12B:
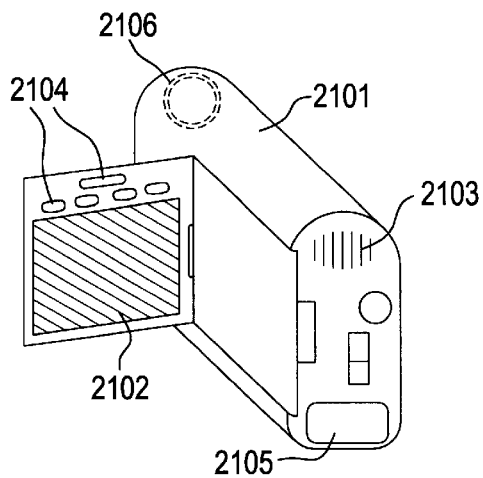

FIG. 12B shows a video camera comprising a main body 2101, a display device 2102, a voice input unit 2103, an operation switch 2104, a battery 2105, and an image receiving unit 2106. The present invention is applicable to the display device 2102, the voice input unit 2103, and other signal control circuits.

Figure 12C:
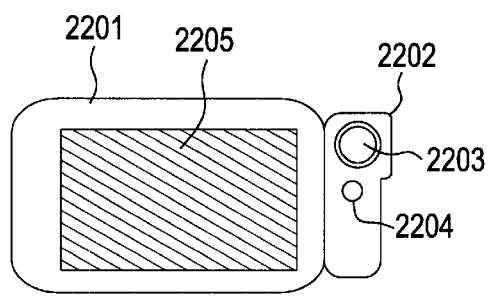

FIG. 12C shows a mobile computer comprising a main body 2201, a camera unit 2202, an image receiving unit 2203, an operation switch 2204, and a display device 2205. The present invention is applicable to the display device 2205 and other signal control circuits.

Figure 12D:
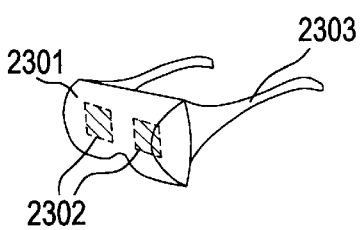

FIG. 12D shows a goggle-type display comprising a main body 2301, a display device 2302 and an arm portion 2303. The present invention is applicable to the display device 2302 and other signal control circuits.

Figure 12E:
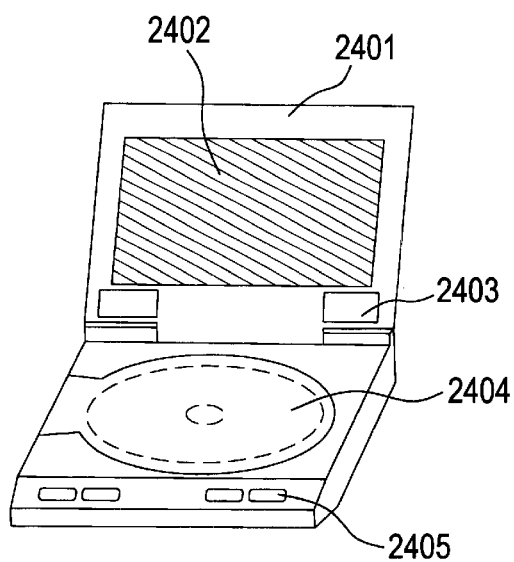

FIG. 12E shows a player that employs a recording medium in which programs are recorded (hereinafter referred to as recording medium), and comprises a main body 2401, a display device 2402, a is speaker unit 2403, a recording medium 2404, and an operation switch 2405. Incidentally, this player uses as the recording medium a DVD (digital versatile disc), a CD and the like to serve as a tool for enjoying music or movies, for playing games and for connecting to the Internet. The present invention is applicable to the display device 2402 and other signal control circuits.

Figure 12F:
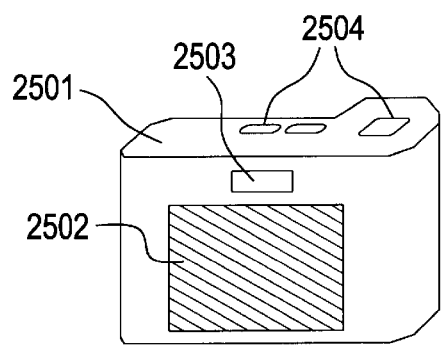

FIG. 12F shows a digital camera comprising a main body 2501, a display device 2502, an eye piece section 2503, an operation switch 2504, and an image receiving unit (not shown). The present invention is applicable to the display device 2502 and other signal control circuits.

Figure 12G:
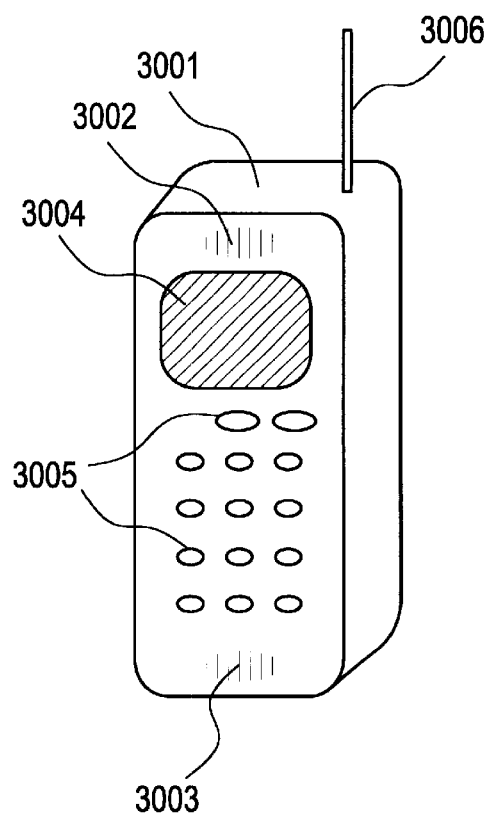

FIG. 12G shows a cellular phone comprising a main body 3001, a voice output unit 3002, a voice input unit 3003, a display portion 3004, an operation switch 3005, and an antenna 3006.

Figure 12H:
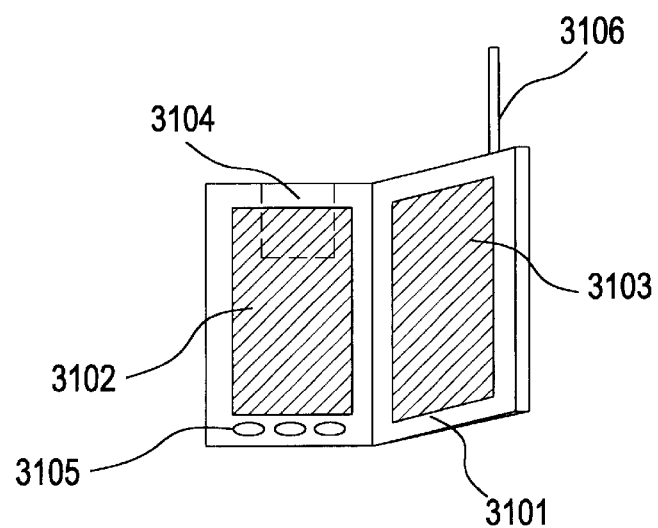

FIG. 12H shows an electronic book comprising a main body 3101, display portions 3102, and 3103, a recording medium 3104, and an operation switch 3105, and an antenna 3106.

Figure 13A:
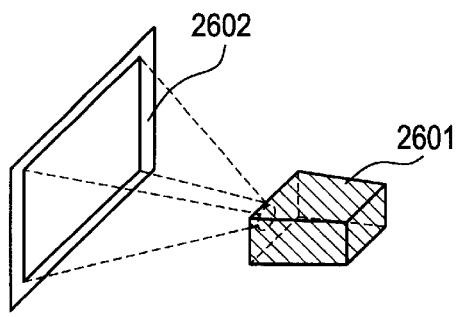
FIGS. 13A to 13D are views showing examples of semiconductor devices (electronic equipments) according to embodiment 8.

FIG. 13A shows a front-type projector comprising a display device 2601 and a screen 2602. The present invention is applicable to the display device and other signal control circuits.

Figure 13B:
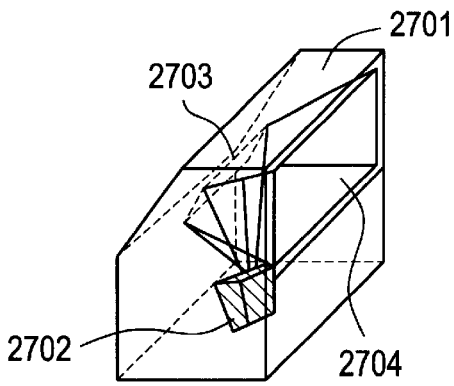

FIG. 13B shows a rear-type projector comprising a main body 2701, a display device 2702, a mirror 2703, and a screen 2704. The present invention is applicable to the display device and other signal control circuits.

Figure 13C:
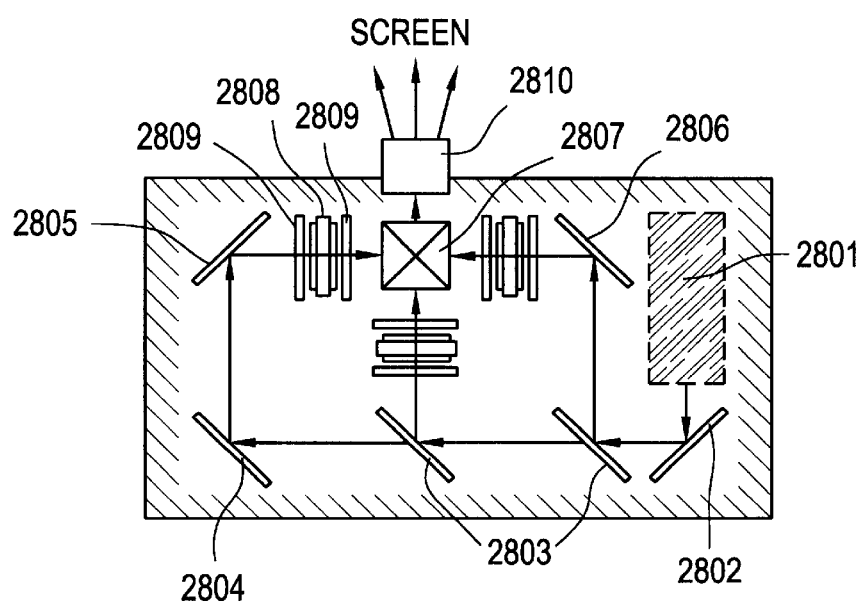

FIG. 13C is a diagram showing an example of the structure of the display devices 2601 and 2702 in FIGS. 13A and 13B. The display device 2601 or 2702 comprises a light source optical system 2801, mirrors 2802 and 2805 to 2807, dichroic mirrors 2803 and 2804, optical lenses 2808, 2809 and 2811, liquid crystal display devices 2810, and a projection optical system 2812. The projection optical system 2812 consists of an optical system including a projection lens. This embodiment shows an example of "three plate type" using three liquid crystal display devices 2810, but not particularly limited thereto. For instance, the invention may be applied also to "single plate type". Further, in the light path indicated by an arrow in FIG. 13C, an optical system such as an optical lens, a film having a polarization function, a film for adjusting a phase difference, an IR film may be provided on discretion of a person who carries out the invention.

Figure 13D:
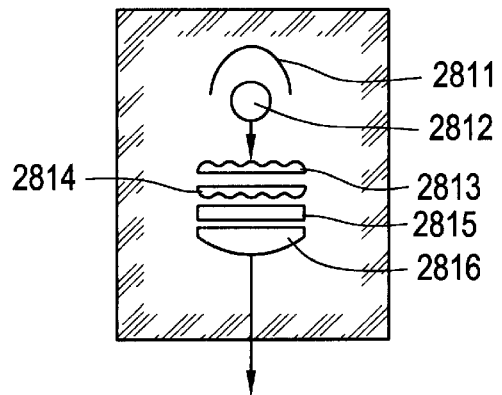

FIG. 13D is a diagram showing an example of the structure of the light source optical system 2801 in FIG. 13C. In this embodiment, the light source optical system 2801 comprises light sources 2813 and 2814, synthetic prism 2815, collimator lenses 2816 and 2820, lens arrays 2817 and 2818, polarizing converter element 2819. The light source optical system shown in FIG. 13D employs two light sources, but may employ three to four of light sources, or more. Of course, it may employ one light source. Further, on discretion of a person who carries out the invention, the light source optical system may be provided with an optical system such as an optical lens, a film having a polarization function, a film for adjusting the phase difference, and an IR film.

As described above, the scope of application of the present invention is very wide, and the invention can be applied to electronic equipments of any fields. The electronic equipment of this embodiment can be realized even if any combination of embodiments 1 to 6 is used.

According to the present invention, it is possible to improve in-plane uniformity of a crystalline semiconductor film obtained by laser annealing with a linear laser beam to a semiconductor film.

Particularly, the crystalline semiconductor film obtained by the laser annealing can be made to have high in-plane uniformity, and the range of the film thickness of the non-single crystal semiconductor film can be widened.

Moreover, although excimer laser beams are mainly utilized in the embodiments of the present invention, another kinds of laser beams can be applied in the present invention. For example, second harmonic (wavelength of 532 nm), third harmonic (wavelength of 355 nm), fourth harmonic (wavelength of 266 nm), and fifth harmonic (wavelength of 213 nm) of a YAG laser can be used in the present invention, respectively.

What is claimed is:

1. A laser irradiation apparatus for carrying out irradiation while scanning a linear laser beam in a beam width direction,
   wherein a beam width W comprises a first beam width $w_1$ and a second beam width $w_2$,
   wherein said laser beam on an irradiation surface has a first energy density $E_1$ in said first beam width $w_1$ and a second energy density $E_2$ in said second beam width $w_2$, and
   wherein said second energy density $E_2$ is higher than said first energy density $E_1$ and a difference between the first energy density $E_1$ and the second energy density $E_2$ is 4% to 30% of the first energy density $E_1$.

2. An apparatus according to claim 1, wherein the first beam width $w_1$ is equal to the second beam width $w_2$.

3. An apparatus according to claim 1 or 2, wherein scanning is carried out from a side of the laser beam having the first energy density $E_1$.

4. An apparatus according to claim 1 or 2, wherein scanning is carried out from a side of the laser beam having the second energy density $E_2$.

5. An apparatus according to claim 1 or 2, wherein scanning is carried out from a side of the laser beam having the first energy density $E_1$, and then, scanning is carried out from a side of the laser beam having the second energy density $E_2$.

6. An apparatus according to claim 1 or 2, wherein scanning is performed from a side of the laser beam having the second energy density $E_2$, and then, scanning is performed from a side of the laser beam having the first energy density $E_1$.

7. An apparatus according to claim 1 or 2, wherein irradiation is carried out in an atmosphere of one selected from the group consisting of He, Ar, $N_2$ and a mixed gas of those.

8. An apparatus according to claim 1, wherein the laser beam is a pulse laser having a frequency of 100 Hz or more.

9. An apparatus according to claim 1 further comprising a beam homogenizer, said beam homogenizer comprising:
   an optical lens for dividing an incident laser beam; and
   an optical system for synthesizing laser beams divided by said optical lens,
   wherein said optical lens includes a cylindrical lens and a semi-cylindrical lens.

10. An apparatus according to claim 9, wherein the semi-cylindrical lens has a shape of one of two congruent solids obtained by dividing a cylindrical lens such that a sectional shape in a length direction becomes rectangular.

11. An apparatus according to claim 9, wherein the optical lens is constituted by plurality of semi-cylindrical lenses.

12. An apparatus according to any one of claim 9, wherein the laser beam is a pulse laser having a frequency of 100 Hz or more.

13. A laser irradiation method comprising a step of scanning a linear laser beam in a beam width direction, a beam width W of said linear laser beam comprising a first beam width $w_1$ and a second beam width $w_2$,
   wherein said laser beam on an irradiated surface has a first energy density $E_1$ in said first beam width $w_1$ and a second energy density $E_2$ in said second beam width $w_2$, and
   wherein the second energy density $E_2$ is higher than the first energy density $E_1$ and a difference between the first energy density $E_1$ and the second energy density $E_2$ is 4% to 30% of the first energy density.

14. A method according to claim 13, wherein the first beam width $w_1$ is equal to the second beam width $w_2$.

15. A method according to claim 13 or 14, wherein scanning is performed from a side of the laser beam having the first energy density $E_1$.

16. A method according to claim 13 or 14, wherein scanning is carried out from a side of the laser beam having the second energy density $E_2$.

17. A method according to claim 13 or 14, wherein scanning is carried out from a side of the laser beam having the first energy density $E_1$, and then, scanning is carried out from a side of the laser beam having the second energy density $E_2$.

18. A method according to claim 13 or 14, wherein scanning is carried out from a side of the laser beam having the second energy density $E_2$, and then, scanning is carried out from a side of the laser beam having the first energy density $E_1$.

19. A method according to claim 13 or 14, wherein irradiation is carried out in an atmosphere of one selected from the group consisting of He, Ar, $N_2$ and a mixed gas of those.

20. A semiconductor device comprising a crystalline semiconductor film,
   wherein said crystalline semiconductor film has been irradiated with a linear laser beam having a beam width W comprising a first beam width $w_1$ and a second beam width $w_2$ by scanning in a beam width direction,
   wherein on an irradiated surface of said semiconductor film, said first beam width $w_1$ has a first energy density $E_1$ and said second beam width $w_2$ has a second energy density $E_2$ which is higher than said first energy density $E_1$, and
   wherein a film thickness of said crystalline semiconductor film is 25 to 75 nm.

21. A device according to claim 20, wherein the semiconductor device is a thin film transistor including an active layer of said crystalline semiconductor film.

22. A method of manufacturing a semiconductor device, comprising steps of:
   irradiating a non-single crystal semiconductor film over a substrate with a linear laser beam, by scanning the linear laser beam in a beam width direction to obtain a crystalline semiconductor film, and
   manufacturing the semiconductor device by using the crystalline semiconductor film,
   wherein said linear laser beam on an irradiation surface has a beam width W comprising a first beam width $w_1$ and a second beam width $w_2$,
   wherein a second energy density $E_2$ in said second beam width $w_2$ is higher than a first energy density $E_1$ in said first beam width $w_1$, and
   wherein a difference between said first energy density $E_1$ and said second energy density $E_2$ is 4% to 30% of the first energy density $E_1$.

23. A method according to claim 22, wherein the first beam width $w_1$ is equal to the second beam width$_2$.

24. A method according to any one of claims 22 and 23, wherein scanning is carried out from a side of the laser beam having the first energy density $E_1$.

25. A method according to any one of claims 22 and 23, wherein scanning is performed from a side of the laser beam having the second energy density $E_2$.

26. A method according to any one of claims 22 and 23, wherein during said irradiating step, a first scanning is carried out in a direction of a $w_1$ side of the beam width W to said non-single crystal semiconductor film to anneal the film into a crystalline semiconductor film, and then, a second scanning is carried out in a direction of a $w_2$ side of the beam width W after said first scanning.

27. A method according to any one of claims 22 and 23, wherein during said irradiating step, a first scanning is carried out in a direction of a $w_2$ side of the beam width W to said non-single crystal semiconductor film to anneal the film into a crystalline semiconductor film, and then, a second scanning is carried out in a direction of a $w_1$ side of the beam width W after said first scanning.

28. A method according to claim 22 or 23, wherein a difference between said first energy density $E_1$ and said second energy density $E_2$ is 4% to 30% of the first energy density $E_1$.

29. A method according to claim 22 or 23, wherein irradiation is carried out in an He atmosphere.

30. A method according to claim 22 or 23, wherein the laser beam is a pulse laser having a frequency of 100 Hz or more.

31. A method according to claim 22 or 23, further comprising steps of:
    forming a semiconductor film comprising silicon over said substrate having an insulating surface; and
    adding an element for promoting crystallization of said silicon to said semiconductor film before said irradiating step.

32. A method of manufacturing a semiconductor device, comprising:
    irradiating a semiconductor film over a substrate with a continuous-wave laser beam to obtain a crystalline semiconductor film,
    wherein the continuous-wave laser beam on an irradiation surface has a beam width W comprising a first beam width $w_1$ and a second beam width $w_2$,
    wherein a second energy density $E_2$ in the second beam width $w_2$ is higher than a first energy density $E_1$ in said first beam width $w_1$, and
    wherein a difference between said first energy density $E_1$ and said second energy density $E_2$ is 4% to 30% of the first energy density $E_1$.

33. A method according to claim 32, wherein the first beam width $w_1$ is equal to the second beam width $w_2$.

34. A method according to claim 32, wherein the continuous-wave laser beam is an excimer laser beam.

35. A method according to claim 32, wherein irradiation is carried out in an atmosphere of one selected from the group consisting of He, Ar, $N_2$ and a mixed gas of those.

36. A method according to claim 32, wherein irradiation is carried out in a He atmosphere.

37. A method according to claim 32, wherein the substrate is a plastic substrate having a silicon oxide film thereon.

38. A method according to claim 32, wherein the semiconductor device comprises an active matrix type electroluminescence display device.

39. A method according to claim 32, wherein the semiconductor device is an electronic equipment selected from the group consisting of a video camera, a digital camera, a rear-type projector, a front-type projector, a head mount display, a goggle-type display, a navigation system for vehicles, a personal computer, a portable information terminal, a mobile computer, a cellular phone, and an electronic book.

40. A method of manufacturing a semiconductor device, comprising:
    irradiating a semiconductor film over a substrate with a second harmonic of a laser beam to obtain a crystalline semiconductor film,
    wherein the second harmonic of the laser beam on an irradiation surface has a beam width W comprising a first beam width $w_1$ and a second beam width $w_2$,
    wherein a second energy density $E_2$ in the second beam width $w_2$ is higher than a first energy density $E_1$ in said first beam width $w_1$, and
    wherein a difference between said first energy density $E_1$ and said second energy density $E_2$ is 4% to 30% of the first energy density $E_1$.

41. A method according to claim 40, wherein the second harmonic of the laser beam has a wavelength of 532 nm.

42. A method according to claim 40, wherein the first beam width $w_1$ is equal to the second beam width $w_2$.

43. A method according to claim 40, wherein the laser beam is a YAG laser.

44. A method according to claim 40, wherein the irradiating is carried out in an atmosphere of one selected from the group consisting of He, Ar, $N_2$ and a mixed gas of those.

45. A method according to claim 40, wherein the irradiating is carried out in a He atmosphere.

46. A method according to claim 40, wherein the substrate is a plastic substrate having a silicon oxide film thereon.

47. A method according to claim 40, wherein the semiconductor device comprises an active matrix type electroluminescence display device.

48. A method according to claim 40, wherein the semiconductor device is an electronic equipment selected from the group consisting of a video camera, a digital camera, a rear-type projector, a front-type projector, a head mount display, a goggle-type display, a navigation system for vehicles, a personal computer, a portable information terminal, a mobile computer, a cellular phone, and an electronic book.

49. A method of manufacturing a semiconductor device, comprising:
    irradiating a semiconductor film over a substrate with a third harmonic of a laser beam to obtain a crystalline semiconductor film,
    wherein the third harmonic of the laser beam on an irradiation surface has a beam width W comprising a first beam width $w_1$ and a second beam width $w_2$,
    wherein a second energy density $E_2$ in the second beam width $w_2$ is higher than a first energy density $E_1$ in said first beam width $w_1$, and
    wherein a difference between said first energy density $E_1$ and said second energy density $E_2$ is 4% to 30% of the first energy density $E_1$.

50. A method according to claim 49, wherein the third harmonic of the laser beam has a wavelength of 355 nm.

51. A method according to claim 49, wherein the first beam width $w_1$ is equal to the second beam width $w_2$.

52. A method according to claim 49, wherein the laser beam is a YAG laser.

53. A method according to claim 49, wherein the irradiating is carried out in an atmosphere of one selected from the group consisting of He, Ar, $N_2$ and a mixed gas of those.

54. A method according to claim 49, wherein the irradiating is carried out in a He atmosphere.

55. A method according to claim 49, wherein the substrate is a plastic substrate having a silicon oxide film thereon.

56. A method according to claim 49, wherein the semiconductor device comprises an active matrix type electroluminescence display device.

57. A method according to claim 49, wherein the semiconductor device is an electronic equipment selected from the group consisting of a video camera, a digital camera, a rear-type projector, a front-type projector, a head mount display, a goggle-type display, a navigation system for vehicles, a personal computer, a portable information terminal, a mobile computer, a cellular phone, and an electronic book.

58. A method of manufacturing a semiconductor device, comprising:

irradiating a semiconductor film over a substrate with a fourth harmonic of a laser beam to obtain a crystalline semiconductor film, wherein the fourth harmonic of the laser beam on an irradiation surface has a beam width W comprising a first beam width $w_1$ and a second beam width $w_2$, wherein a second energy density $E_2$ in the second beam width $w_2$ is higher than a first energy density $E_1$ in said first beam width $w_1$, and wherein a difference between said first energy density $E_1$ and said second energy density $E_2$ is 4% to 30% of the first energy density $E_1$.

59. A method according to claim 58, wherein the fourth harmonic of the laser beam has a wavelength of 266 nm.

60. A method according to claim 58, wherein the first beam width $w_1$ is equal to the second beam width $w_2$.

61. A method according to claim 58, wherein the laser beam is a YAG laser.

62. A method according to claim 58, wherein the irradiating is carried out in an atmosphere of one selected from the group consisting of He, Ar, $N_2$ and a mixed gas of those.

63. A method according to claim 58, wherein the irradiating is carried out in a He atmosphere.

64. A method according to claim 58, wherein the substrate is a plastic substrate having a silicon oxide film thereon.

65. A method according to claim 58, wherein the semiconductor device comprises an active matrix type electroluminescence display device.

66. A method according to claim 58, wherein the semiconductor device is an electronic equipment selected from the group consisting of a video camera, a digital camera, a rear-type projector, a front-type projector, a head mount display, a goggle-type display, a navigation system for vehicles, a personal computer, a portable information terminal, a mobile computer, a cellular phone, and an electronic book.

* * * * *